United States Patent
Suganuma et al.

(10) Patent No.: US 7,880,153 B2
(45) Date of Patent: Feb. 1, 2011

(54) EXTREME ULTRA VIOLET LIGHT SOURCE APPARATUS

(75) Inventors: Takashi Suganuma, Ooiso (JP); Tamotsu Abe, Odawara (JP); Hiroshi Someya, Hiratsuka (JP); Akira Sumitani, Isehara (JP)

(73) Assignee: Komatsu Ltd., Tokyo (JP)

( * ) Notice: Subject to any disclaimer, the term of this patent is extended or adjusted under 35 U.S.C. 154(b) by 167 days.

(21) Appl. No.: 12/073,001

(22) Filed: Feb. 28, 2008

(65) Prior Publication Data
US 2008/0210889 A1 Sep. 4, 2008

(30) Foreign Application Priority Data
Mar. 2, 2007 (JP) ............... 2007-052301

(51) Int. Cl.
*H05G 2/00* (2006.01)
*G01J 1/42* (2006.01)

(52) U.S. Cl. ............. 250/504 R; 250/372; 250/461.1; 250/493.1; 378/34

(58) Field of Classification Search .......... 250/372, 250/461.1, 462.2, 493.1, 494.1, 504 R, 505.1; 378/34, 119, 145
See application file for complete search history.

(56) References Cited

U.S. PATENT DOCUMENTS

| | | | | |
|---|---|---|---|---|
| 4,408,338 | A * | 10/1983 | Grobman | 378/34 |
| 7,476,886 | B2 | 1/2009 | Bykanov et al. | |
| 2001/0055733 | A1* | 12/2001 | Irie et al. | 430/396 |
| 2002/0162975 | A1* | 11/2002 | Orsini | 250/504 R |
| 2004/0135517 | A1* | 7/2004 | Schriever et al. | 315/111.21 |
| 2004/0256575 | A1* | 12/2004 | Singer et al. | 250/492.2 |
| 2005/0112510 | A1* | 5/2005 | Bakker | 430/396 |
| 2005/0122589 | A1* | 6/2005 | Bakker | 359/591 |
| 2006/0013315 | A1* | 1/2006 | Song | 375/240.24 |
| 2006/0078017 | A1* | 4/2006 | Endo et al. | 372/38.02 |
| 2006/0160031 | A1* | 7/2006 | Wurm et al. | 430/322 |
| 2007/0008517 | A1* | 1/2007 | Fomenkov et al. | 356/218 |
| 2007/0023705 | A1* | 2/2007 | Partlo et al. | 250/504 R |
| 2007/0114469 | A1* | 5/2007 | Partlo et al. | 250/504 R |
| 2007/0114470 | A1* | 5/2007 | Bowering | 250/504 R |
| 2007/0144681 | A1* | 6/2007 | Cunningham | 157/1.24 |
| 2007/0170379 | A1* | 7/2007 | Watson et al. | 250/515.1 |
| 2007/0228298 | A1* | 10/2007 | Komori et al. | 250/493.1 |
| 2008/0083887 | A1* | 4/2008 | Komori et al. | 250/504 R |
| 2008/0158535 | A1* | 7/2008 | Goldstein et al. | 355/67 |

(Continued)

FOREIGN PATENT DOCUMENTS

JP 11-126745 5/1999

*Primary Examiner*—Bernard E Souw
(74) *Attorney, Agent, or Firm*—Wenderoth, Lind & Ponack L.L.P.

(57) ABSTRACT

An EUV light source apparatus capable of preventing deterioration and/or breakage of a filter for filtering EUV light. The EUV light source apparatus includes an EUV generation chamber in which EUV light is generated; a target material supply unit for supplying a target material into the EUV light generation chamber; a laser source for applying a laser beam to the target material supplied into the EUV light generation chamber to generate plasma; collection optics for collecting EUV light radiated from the plasma; a filter for filtering the EUV light collected by the collection optics; and a filter protecting member provided between the plasma and the filter, for protecting the filter by blocking flying matter flying from the plasma toward the filter.

15 Claims, 21 Drawing Sheets

U.S. PATENT DOCUMENTS

2008/0197299 A1* 8/2008 Hoshino et al. ......... 250/504 R
2008/0210889 A1* 9/2008 Suganuma et al. ...... 250/504 R
2009/0250641 A1* 10/2009 Moriya et al. ........... 250/504 R
2009/0272919 A1* 11/2009 Abe et al. ............... 250/504 R
2009/0314967 A1* 12/2009 Moriya et al. ........... 250/504 R
2010/0025231 A1* 2/2010 Moriya et al. .......... 204/192.32
2010/0108918 A1* 5/2010 Nagai et al. .............. 250/504 R
2010/0181503 A1* 7/2010 Yanagida et al. ........ 250/504 R

* cited by examiner

EXTREME ULTRA VIOLET LIGHT SOURCE APPARATUS

BACKGROUND OF THE INVENTION

1. Field of the Invention

The present invention relates to an LPP (Laser Produced Plasma) EUV (Extreme Ultra Violet) light source apparatus for generating extreme ultra violet light to be used for exposure of semiconductor wafers or the like, in which breakage of a filter for filtering EUV light can be prevented.

2. Description of a Related Art

Recent years, as semiconductor processes become finer, photolithography has been making rapid progress to finer fabrication. In the next generation, microfabrication of 100 nm to 70 nm, further, microfabrication of 50 nm or less will be required. Accordingly, in order to fulfill the requirement for microfabrication of 50 nm or less, for example, exposure equipment is expected to be developed by combining an EUV light source generating EUV light with a wavelength of about 13 nm and reduced projection reflective optics.

As the EUV light source, there are three kinds of light sources, which include an LPP (laser produced plasma) light source using plasma generated by applying a laser beam to a target, a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be considerably made larger, that light emission of only the necessary waveband can be performed by selecting the target material, and that an extremely large collection solid angle of $2\pi$ steradian can be ensured because it is a point light source having substantially isotropic angle distribution and there is no structure surrounding the light source such as electrodes. Therefore, the LPP light source is considered to be predominant as a light source for EUV lithography requiring power of more than several tens of watts.

FIG. 21 is a schematic diagram showing a configuration of a general LPP type EUV light source apparatus. As shown in FIG. 21, the EUV light source apparatus includes a laser source 101, an EUV generation chamber 102, a target material supply unit 103, and laser beam focusing optics 104.

The laser source 101 generates a laser beam for driving a laser beam to be used for excitation of a target material. The EUV generation chamber 102 is a vacuum chamber in which EUV light is generated. The EUV generation chamber 102 is provided with a window 106 for allowing a laser beam generated from the laser source 101 to pass into the EUV generation chamber 102. Further, a target injection nozzle 103a, a target material collecting tube 107, and an EUV light collector mirror 108 are provided within the EUV generation chamber 102.

The target material supply unit 103 supplies the target material to be used for generation of EUV light through the target injection nozzle 103a as a part of the target material supply unit 103 into the EUV generation chamber 102. A piezoelectric element 103b is provided to the target injection nozzle 103a for vibrating the target injection nozzle 103a during injection of the liquid target material, and thus, droplets 109 of the target material can be formed. The unnecessary material, to which the laser beam has not been applied, of the supplied target materials is collected by the target material collecting tube 107.

The laser beam focusing optics 104 collects the laser beam 110 emitted from the laser source 101 to form a focal point at a laser beam application point 111 in a path of the target material. Thereby, the target material 109 is excited and plasmatized, and EUV light 112 is generated.

The EUV light collector mirror 108 is a concave mirror having an Mo/Si film that reflects light of 13.5 nm, for example, with high reflectivity formed on its surface, and reflects the generated EUV light 112 to the right in the drawing for collection on IF (intermediate focusing point).

The EUV light 112 reflected by the EUV light collector mirror 108 passes through a gate valve 113 provided in the EUV generation chamber 2, and an SPF (spectral purity filter) 114 that removes unwanted light (electromagnetic wave (light) having a shorter wavelength than EUV light, light having a longer wavelength than EUV light (e.g., ultraviolet light, visible light, infrared light, or the like)) of the light generated from the plasma and allows only desired EUV light (e.g., light having a wavelength of 13.5 nm) to pass through. The EUV light 112 collected on the IF (intermediate focusing point) is then guided via transmission optics to an exposure unit or the like. As the SPF 114, for example, a wavelength selective filter described in Japanese Patent Application Publication JP-A-11-126745 may be used.

In this regard, flying matter (called debris) such as fast ions or target material is generated from the plasma, and the flying matter may enter the SPF 114. However, the SPF 114 is thin and the SPF 114 is easily deteriorated and/or broken when the flying matter enters the SPF 114.

SUMMARY OF THE INVENTION

The present invention has been achieved in view of the above-mentioned problem. A purpose of the present invention is to provide an extreme ultra violet light source apparatus capable of preventing deterioration and/or breakage of a filter for filtering extreme ultra violet light.

In order to accomplish the above purpose, an extreme ultra violet light source apparatus according to one aspect of the present invention is an apparatus for generating extreme ultra violet light by applying a laser beam to a target material, and the apparatus includes: an extreme ultra violet light generation chamber in which extreme ultra violet light is generated; a target material supply unit which supplies a target material into the extreme ultra violet light generation chamber; a laser source which applies a laser beam to the target material supplied into the extreme ultra violet light generation chamber to generate plasma; collection optics which collects extreme ultra violet light radiated from the plasma; a filter which filters the extreme ultra violet light collected by the collection optics; and a filter protecting member which is provided between the plasma and the filter, and which protects the filter by blocking flying matter flying from the plasma toward the filter.

According to the present invention, the flying matter flying from the plasma toward the filter can be blocked. Thereby, the flying matter can be prevented from entering the filter, and the deterioration and/or breakage of the filter can be prevented.

DESCRIPTION OF THE PREFERRED EMBODIMENTS

Figure 1:
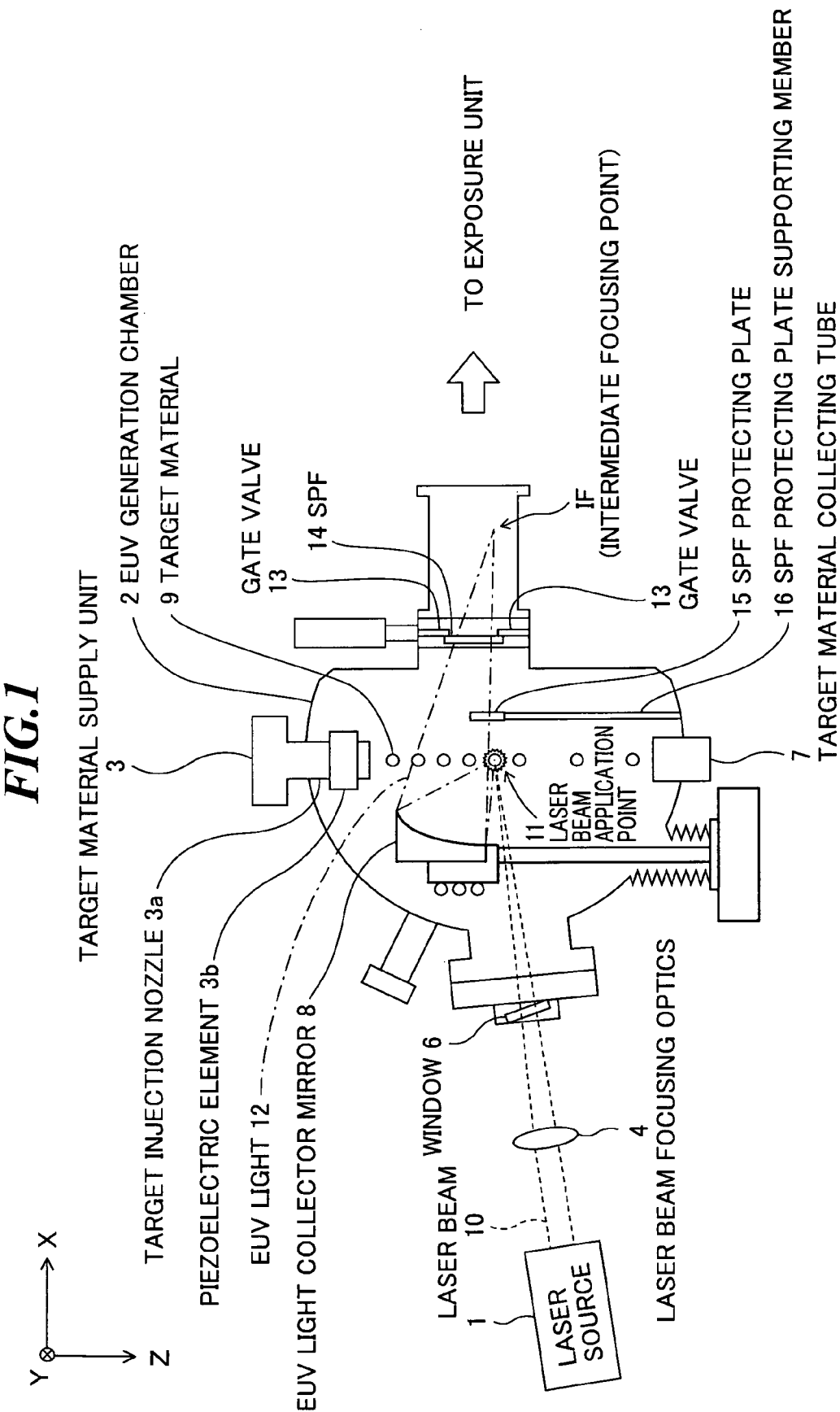
FIG. 1 is a schematic diagram showing a configuration of an LPP type EUV light source apparatus according to the present invention.

Hereinafter, preferred embodiments of the present invention will be explained in detail by referring to the drawings. The same reference numerals are assigned to the same component elements and the explanation thereof will be omitted.

FIG. 1 is a schematic diagram showing an overview of an extreme ultra violet light source apparatus (hereinafter, also simply referred to "EUV light source apparatus") according to the present invention. Here, the present invention is applied to an LPP (laser produced plasma) type EUV light source apparatus in which a target material is supplied as droplets.

The present invention may be applied to an EUV light source apparatus in which a target material is supplied as a continuous flow (target jet).

As shown in FIG. 1, the EUV light source apparatus includes a laser source 1, an EUV generation chamber 2, a target material supply unit 3, and laser beam focusing optics 4.

The laser source 1 is an oscillation/amplification laser device that generates a driving laser beam to be used for excitation of the target material. As the laser source 1, various known lasers (e.g., ultraviolet lasers of KrF, XeF, and so on, infrared lasers of Ar, $CO_2$, YAG, and so on) may be used.

The EUV generation chamber 2 is a vacuum chamber in which EUV light is generated. The EUV generation chamber 2 is provided with a window 6 for allowing a laser beam generated from the laser source 1 to pass into the EUV generation chamber 2. Further, a target injection nozzle 3a, a target material collecting tube 7, and an EUV light collector mirror 8 are provided within the EUV generation chamber 2.

The target material supply unit 3 supplies the target material to be used for generation of EUV light through the target injection nozzle 3a as a part of the target material supply unit 3 into the EUV generation chamber 2. The unnecessary material, to which the laser beam has not been applied, of the supplied target materials is collected by the target material collecting tube 7. As the target material, various known materials (e.g., tin (Sn), xenon (Xe), or the like) may be used. Further, the state of the target material may be any of solid (e.g., micro metal particles dispersed in a liquid), liquid, or gas, and the target material may be supplied to the space within the EUV generation chamber 2 in any known form of continuous flow (target jet), droplets, or the like. For example, a liquid xenon (Xe) target is used as the target material, the target material supply unit 3 includes a compressed gas cylinder for supplying high-purity xenon gas, a mass flow controller, a cooling unit for liquefying the xenon gas, and a target injection nozzle, and so on. Alternatively, when droplets are generated, as shown in FIG. 1, a vibrating unit (here, piezoelectric element 3b) is provided to the target injection nozzle 3a, and the liquid target material is injected while the target injection nozzle 3a is vibrated, and thus, droplets 9 of the target material can be formed.

The laser beam focusing optics 4 collects a laser beam 10 outputted from the laser source 1 to form a focal point at a laser beam application point 11 in a path of the target material. Thereby, the target material 9 is excited and plasmatized, and EUV light 12 is generated. The laser beam focusing optics 4 may be formed by one optical element (e.g., one convex lens or the like), or plural optical elements. When the laser beam focusing optics 4 is formed by plural optical elements, some of them may be provided within the EUV generation chamber 2.

The EUV light collector mirror 8 is a concave mirror having an Mo/Si film that reflects light having a wavelength of 13.5 nm, for example, with high reflectivity formed on its surface, and reflects the generated EUV light 112 to the right in the drawing for collection on IF (intermediate focusing point). The EUV light 12 reflected by the EUV light collector mirror 8 passes through a gate valve 13 provided in the EUV generation chamber 2 and an SPF (spectral purity filter) 14 that removes unwanted light (electromagnetic wave (light)) having a shorter wavelength than EUV light, light having a longer wavelength than EUV light (e.g., ultraviolet light, visible light, infrared light, or the like)) of the light generated from the plasma and allows only desired EUV light (e.g., light having a wavelength of 13.5 nm) to pass through. The shape of the SPF 14 may be a disk shape, for example. The EUV light 12 collected on the IF (intermediate focusing point) is then guided via transmission optics to an exposure unit or the like.

An SPF protecting plate 15 as a filter protecting member for protecting the SPF 14 by blocking the flying matter (e.g., fast ions, the target material, or the like) flying from plasma toward the SPF 14 is provided between the plasma generation position (laser beam application point 11) and the SPF 14. The SPF protecting plate 15 is supported by an SPF protecting plate supporting member 16 attached to the EUV generation chamber 2. The shape of the SPF protecting plate 15 may be a disk shape, for example.

The member located near the plasma such as the SPF protecting plate 15 may be scraped off by the flying matter. When the scraped component member of the SPF protecting plate 15 flies and adheres to the EUV light reflecting surface (EUV light collecting surface) of the EUV light collector mirror 8, the reflectance of the EUV light collector mirror 8 becomes lower. On this account, as the material of the SPF protecting plate 15, a material that is hard to be scraped off by the flying matter or, even when scraped off and adhering to the EUV light reflecting surface of the EUV light collector mirror 8, a material that minimally reduces the reflectance of the EUV light collector mirror 8 (e.g., silicon (Si), zirconium (Zr), or the like) is preferable. It is known that silicon (Si) or zirconium (Zr) transmits more EUV light or has higher EUV light transmittance than iron (Fe) or nickel (Ni) in comparison under the condition of the same thickness. That is, even when silicon (Si) or zirconium (Zr) adheres to the EUV light reflecting surface of the EUV light collector mirror 8 in a certain thickness, it reduces the EUV light reflectance of the EUV light collector mirror 8 less than that in the case where iron (Fe) or nickel (Ni) adheres to the EUV light reflecting surface of the EUV light collector mirror 8 in the same thickness. Therefore, silicon (Si), zirconium (Zr), or the like is more preferable for the material of the SPF protecting plate 15 than iron (Fe), nickel (Ni), or the like.

Further, in order to reduce the reflection of the flying matter that has collided with the SPF protecting plate 15 toward the EUV light collector mirror 8 by the SPF protecting plate 15, a material that is hard to reflect the flying matter (e.g., a metal porous material such as Celmet (registered trademark) or the like) may be attached to the plasma side surface of the SPF protecting plate 15 or the surface may be coated with the material.

According to the EUV light source apparatus of the present invention, the flying matter flying from the plasma and/or target material toward the SPF 14 can be blocked by providing the SPF protecting plate 15 between the plasma generation position (laser beam application point 11) and the SPF 14. Thereby, the flying matter can be prevented from entering the SPF 14, and deterioration and/or breakage of the SPF 14 can be prevented.

Next, an EUV light source apparatus according to the first embodiment of the present invention will be explained.

Figure 2:
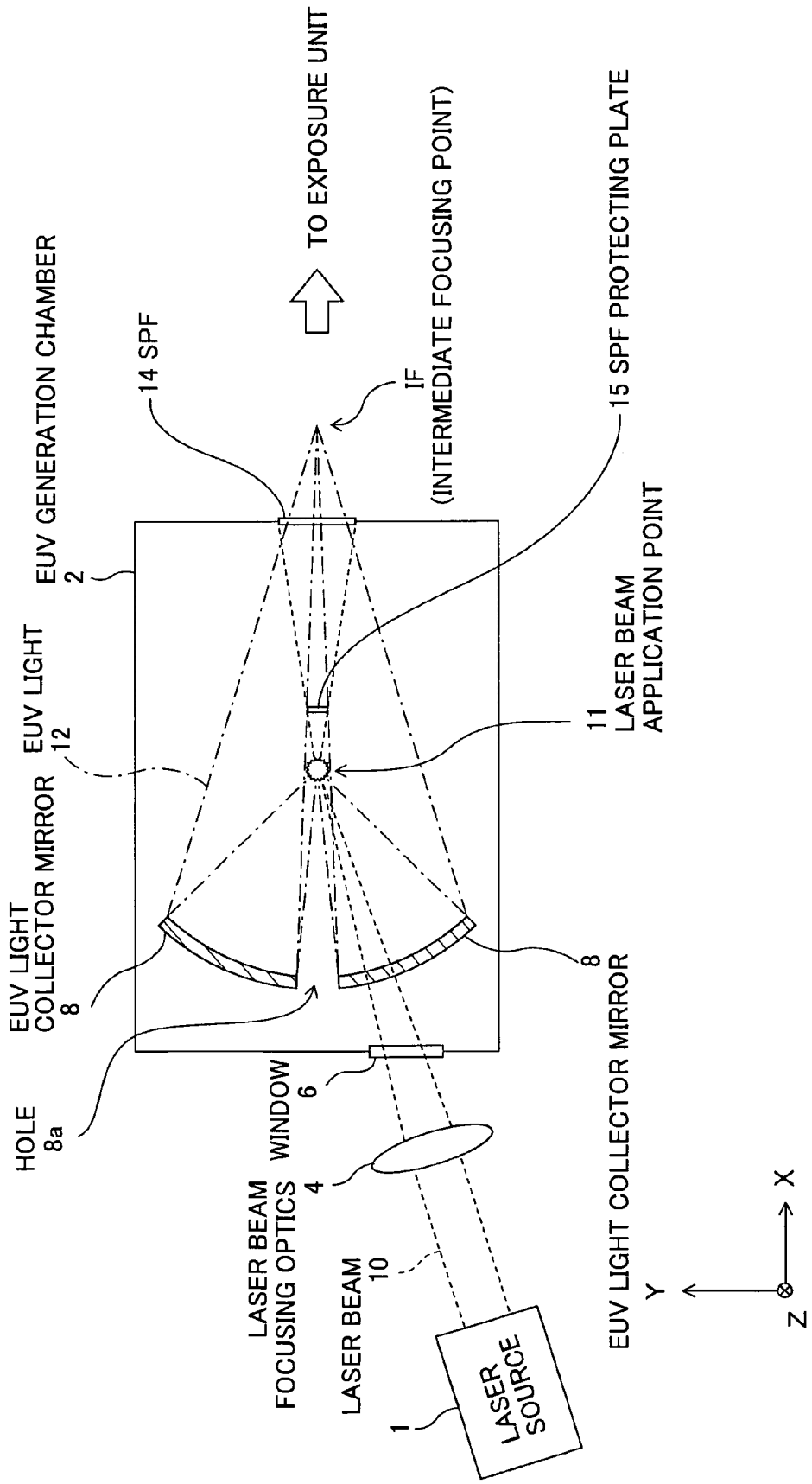
FIG. 2 is a schematic diagram showing a configuration of an LPP type EUV light source apparatus according to the first embodiment of the present invention.
Figure 3:
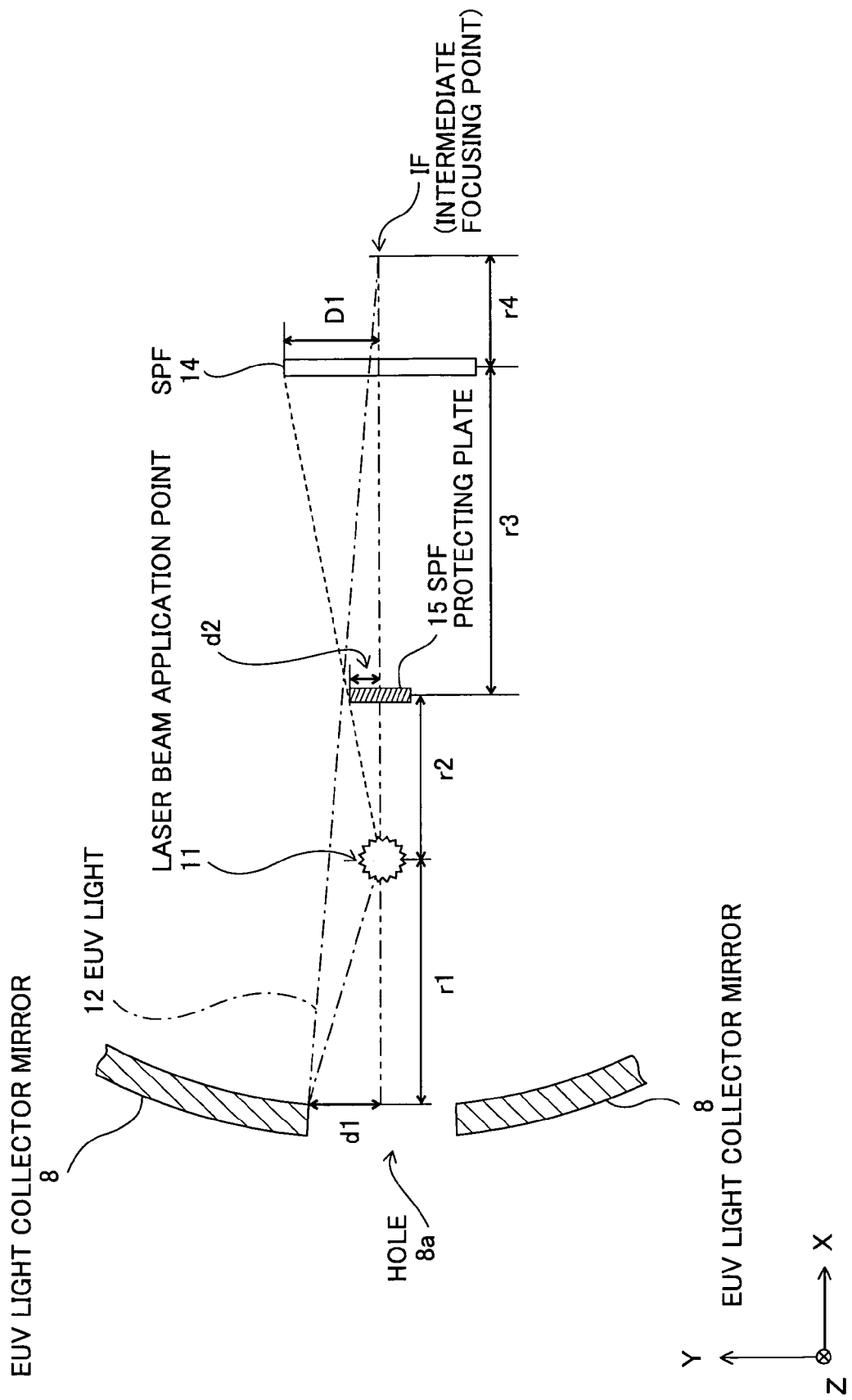
FIG. 3 is a schematic diagram showing the configuration of the LPP type EUV light source apparatus according to the first embodiment of the present invention.

FIG. 2 is a schematic diagram showing the EUV light source apparatus according to the first embodiment. In FIG. 2, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing. Further, FIG. 3 is an enlarged view of the EUV light collector mirror 8, the laser beam application point 11, the SPF 14, and the SPF protecting plate 15 in FIG. 2.

As shown in FIG. 2, the laser beam 10 outputted from the laser source 1 toward the upper right in the drawing is collected by the laser beam focusing optics 4, and enters the EUV generation chamber 2 through the window 6. The laser beam 10 that has entered the EUV generation chamber 2 through the window 6 passes through the depth side of the EUV light collector mirror 8 in the drawing (see also FIG. 1), and is collected onto the laser beam application point 11. Thereby, the target material is excited and plasmatized, and EUV light 12 is generated.

The EUV light collector mirror 8 reflects the generated EUV light 12 toward the right in the drawing to collect the light on the IF (intermediate focusing point). The EUV light 12 reflected by the EUV light collector mirror 8 passes through the SPF 14. The EUV light 12 that has been focused on the IF (intermediate focusing point) is then guided via transmission optics to an exposure unit or the like.

The SPF protecting plate 15 is provided between the plasma generation position (laser beam application point 11) and the SPF 14. The size and location of the SPF protecting plate 15 may be determined according to the design of the EUV light source apparatus. For example, it is preferable that the size and location of the SPF protecting plate 15 are determined such that the SPF 14 is contained within a hypothetical cone defined by the side ends of the SPF protecting plate 15 with the plasma generation position as an apex. Thus, the matter flying from the plasma toward the SPF 14 is prevented from entering the SPF 14 by the SPF protecting plate 15.

Further, as shown in FIG. 2, the EUV light collector mirror 8 may have a hole 8a near the center for the reason that a liquid agent is removed in the manufacturing process or the like. In this case, it is preferable that the size and location of the SPF protecting plate 15 are determined by taking the size of the hole 8a into consideration.

For example, as shown in FIG. 3, it is given that the radius of the hole 8a of the EUV light collector mirror is d1, the radius of the SPF protecting plate 15 is d2, the radius of the SPF 14 is D1, the distance between the EUV light collector mirror 8 and the laser beam application point 11 is r1, the distance between the laser beam application point 11 and the SPF protecting plate 15 is r2, the distance between the SPF protecting plate 15 and the SPF 14 is r3, and the distance between the SPF 14 and the IF (intermediate focusing point) is r4. Further, the thickness of the SPF protecting plate 15 and the SPF 14 are out of consideration.

Here, in order that the SPF protecting plate 15 may not block the EUV light propagating in the path from the laser beam application point 11 through the EUV light collector mirror 8 and the SPF 14 to the IF (intermediate focusing point), it is preferable that the radius d2 of the SPF protecting plate 15 satisfies the following condition from the relation of trigonometrical ratio.

$$d2 < \frac{(r3 + r4) \cdot d1}{r1 + r2 + r3 + r4} \qquad (1)$$

Further, in order that the SPF protecting plate 15 may prevent the flying matter flying from the laser beam application point 11 toward the SPF 14 from entering the SPF 14, it is preferable that the radius d2 of the SPF protecting plate 15 satisfies the following condition from the relation of trigonometrical ratio.

$$d2 > \frac{r2 \cdot D1}{r2 + r3} \quad (2)$$

Therefore, from the above expressions (1) and (2), in order that the SPF protecting plate 15 may not block the EUV light propagating in the path from the laser beam application point 11 through the EUV light collector mirror 8 and the SPF 14 to the IF (intermediate focusing point) but may prevent the flying matter flying from the laser beam application point 11 toward the SPF 14 from entering the SPF 14, it is preferable that the radius d2 of the SPF protecting plate 15 satisfies the following condition from the relation of trigonometrical ratio.

$$\frac{r2 \cdot D1}{r2 + r3} < d2 < \frac{(r3 + r4) \cdot d1}{r1 + r2 + r3 + r4} \quad (3)$$

Next, an EUV light source apparatus according to the second embodiment of the present invention will be explained.

Figure 4:
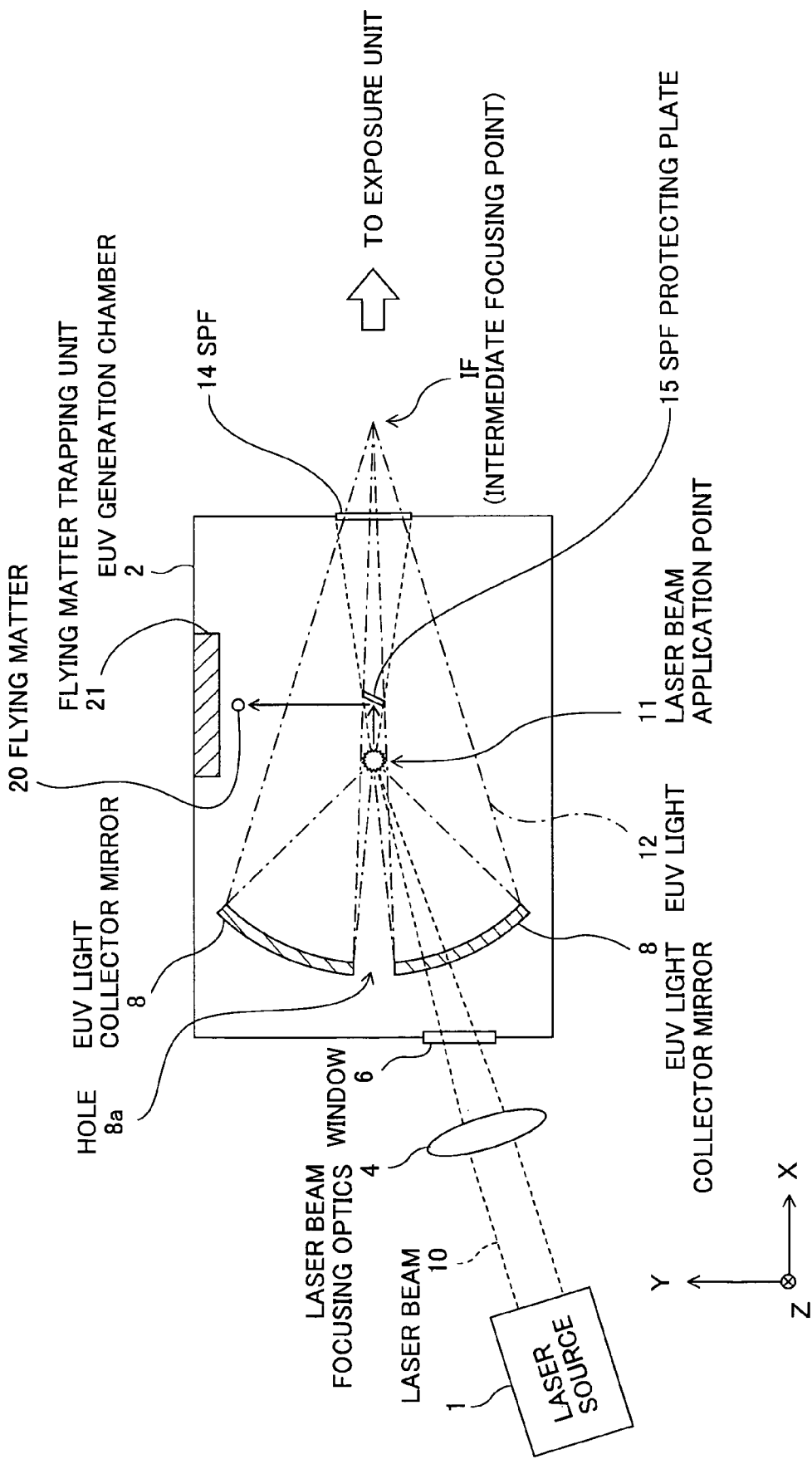
FIG. 4 is a schematic diagram showing a configuration of an LPP type EUV light source apparatus according to the second embodiment of the present invention.

FIG. 4 is a schematic diagram showing the EUV light source apparatus according to the second embodiment. In FIG. 4, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing. Further, FIG. 5 is an enlarged view of the EUV light collector mirror 8, the laser beam application point 11, the SPF 14, and the SPF protecting plate 15 in FIG. 4.

In the above explained EUV light source apparatus according to the first embodiment, the SPF protecting plate 15 is provided so as to be substantially orthogonal to the line connecting the laser beam application point 11 and the IF (intermediate focusing point) (see FIGS. 2 and 3).

Figure 5:
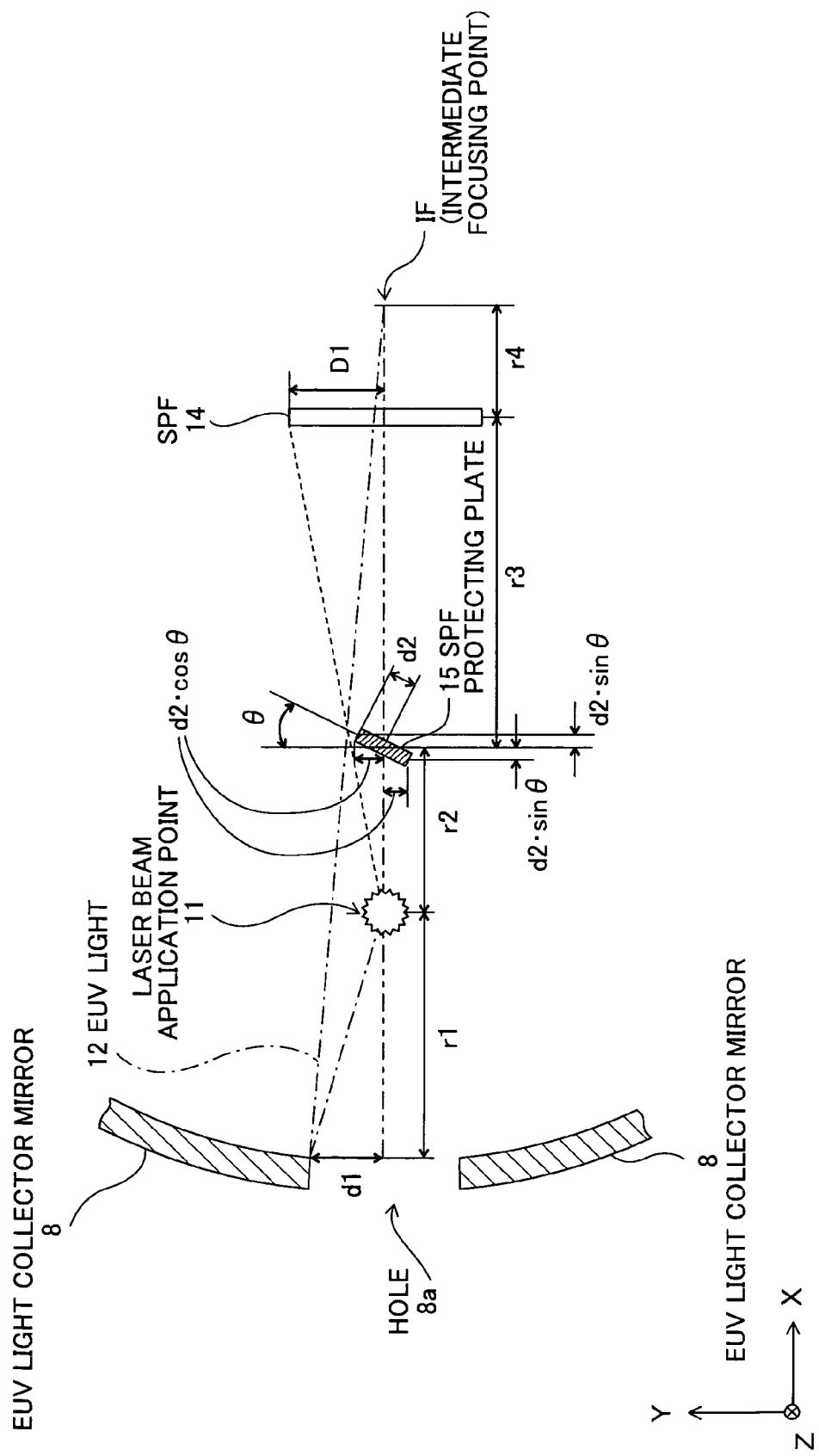
FIG. 5 is a schematic diagram showing the configuration of the LPP type EUV light source apparatus according to the second embodiment of the present invention.

On the other hand, in the EUV light source apparatus according to the second embodiment, as shown in FIGS. 4 and 5, the SPF protecting plate 15 is provided such that the surface thereof forms a predetermined angle θ (0°<θ<90°) with a surface orthogonal to the line connecting the laser beam application point 11 and the IF (intermediate focusing point). By providing the SPF protecting plate 15 in this manner, in the case where the flying matter 20, that has been emitted from the plasma generation position (laser beam application point 11) and has collided with the SPF protecting plate 15, is reflected by the SPF protecting plate 15, the flying matter 20 reflected by the SPF protecting plate 15 flies not toward the EUV light collector mirror 8 but toward the wall surface of the EUV generation chamber 2. Thereby, adhesion of the flying matter 20 reflected by the SPF protecting plate 15 to the EUV light collector mirror 8 can be reduced.

Further, in order to reduce the reflection of the flying matter 20, that has been emitted from the plasma generation position (laser beam application point 11) and has collided with the SPF protecting plate 15, by the SPF protecting plate 15, a material that is hard to reflect the flying matter (e.g., a metal porous material or the like) may be attached to the plasma side surface of the SPF protecting plate 15 or the surface may be coated with the material.

Furthermore, as shown in FIG. 4, it is more preferable that a flying matter trapping unit 21 for trapping the flying matter 20 reflected by the SPF protecting plate 15 is provided on the inner wall surface of the EUV generation chamber 2. As the flying matter trapping unit 21, for example, a metal porous material or the like may be used. In the case where xenon (Xe) is used as the target material, it is still more preferable that the flying matter trapping unit 21 is heated by a heater or the like because the target matter flying to the flying matter trapping unit 21 may be gasified.

The size, location, and positional angle of the SPF protecting plate 15 may be determined according to the design of the EUV light source apparatus. For example, it is preferable that the size, location, and positional angle of the SPF protecting plate 15 are determined such that the SPF 14 is contained within a hypothetical cone defined by the side ends of the SPF protecting plate 15 with the plasma generation position as an apex. Thus, the matter flying from the plasma and/or the target material toward the SPF 14 can be prevented from colliding with the SPF 14 by the SPF protecting plate 15.

Further, the EUV light collector mirror 8 may have a hole 8a near the center. In this case, it is preferable that the size and location of the SPF protecting plate 15 are determined by taking the size of the hole 8a into consideration.

For example, as shown in FIG. 5, it is given that the radius of the hole 8a of the EUV light collector mirror is d1, the radius of the SPF protecting plate 15 is d2, the radius of the SPF 14 is D1, the distance between the EUV light collector mirror 8 and the laser beam application point 11 is r1, the distance between the laser beam application point 11 and the SPF protecting plate 15 is r2, the distance between the SPF protecting plate 15 and the SPF 14 is r3, the distance between the SPF 14 and the IF (intermediate focusing point) is r4, and the angle formed by the surface orthogonal to the line connecting the laser beam application point 11 and the IF (intermediate focusing point) and the SPF protecting plate 15 is θ (0°<θ<90°). Further, the thickness of the SPF protecting plate 15 and the SPF 14 are out of consideration.

First, the part upper than the line connecting the laser beam application point 11 and the IF (intermediate focusing point) in the drawing will be explained.

In order that the SPF protecting plate 15 may not block the EUV light propagating in the path from the laser beam application point 11 through the EUV light collector mirror 8 and the SPF 14 to the IF (intermediate focusing point), it is preferable that the radius d2 of the SPF protecting plate 15 satisfies the following condition from the relation of trigonometrical ratio.

$$d2 < \frac{(r3 + r4) \cdot d1}{(r1 + r2 + r3 + r4) \cdot \cos\theta + d1 \cdot \sin\theta} \quad (4)$$

Further, in order that the SPF protecting plate 15 may prevent the flying matter flying from the laser beam application point 11 toward the SPF 14 from entering the SPF 14, it is preferable that the radius d2 of the SPF protecting plate 15 satisfies the following condition from the relation of trigonometrical ratio.

$$d2 > \frac{r2 \cdot D1}{(r2 + r3) \cdot \cos\theta - D1 \cdot \sin\theta} \quad (5)$$

Therefore, from the above expressions (4) and (5) in order that the SPF protecting plate 15 may not block the EUV light propagating in the path from the laser beam application point 11 through the EUV light collector mirror 8 and the SPF 14 to the IF (intermediate focusing point) but may prevent the flying matter flying from the laser beam application point 11 toward the SPF 14 from entering the SPF 14, it is preferable that the radius d2 of the SPF protecting plate 15 satisfies the following condition from the relation of trigonometrical ratio.

$$\frac{r2 \cdot D1}{(r2+r3) \cdot \cos\theta - D1 \cdot \sin\theta} < d2 < \frac{(r3+r4) \cdot d1}{(r1+r2+r3+r4) \cdot \cos\theta + d1 \cdot \sin\theta} \quad (6)$$

Then, the part lower than the line connecting the laser beam application point 11 and the IF (intermediate focusing point) in the drawing will be explained.

In order that the SPF protecting plate 15 may not block the EUV light propagating in the path from the laser beam application point 11 through the EUV light collector mirror 8 and the SPF 14 to the IF (intermediate focusing point), it is preferable that the radius d2 of the SPF protecting plate 15 satisfies the following condition from the relation of trigonometrical ratio.

$$d2 < \frac{(r3+r4) \cdot d1}{(r1+r2+r3+r4) \cdot \cos\theta - d1 \cdot \sin\theta} \quad (7)$$

Further, in order that the SPF protecting plate 15 may prevent the flying matter flying from the laser beam application point 11 toward the SPF 14 from entering the SPF 14, it is preferable that the radius d2 of the SPF protecting plate 15 satisfies the following condition from the relation of trigonometrical ratio.

$$d2 > \frac{r2 \cdot D1}{(r2+r3) \cdot \cos\theta + D1 \cdot \sin\theta} \quad (8)$$

Therefore, from the above expressions (7) and (8), in order that the SPF protecting plate 15 may not block the EUV light propagating in the path from the laser beam application point 11 through the EUV light collector mirror 8 and the SPF 14 to the IF (intermediate focusing point) but may prevent the flying matter flying from the laser beam application point 11 toward the SPF 14 from entering the SPF 14, it is preferable that the radius d2 of the SPF protecting plate 15 satisfies the following condition from the relation of trigonometrical ratio.

$$\frac{r2 \cdot D1}{(r2+r3) \cdot \cos\theta + D1 \cdot \sin\theta} < d2 < \frac{(r3+r4)}{(r1+r2+r3+r4) \cdot \cos\theta - d1 \cdot \sin\theta} \quad (9)$$

Next, an EUV light source apparatus according to the third embodiment of the present invention will be explained.

Figure 6:
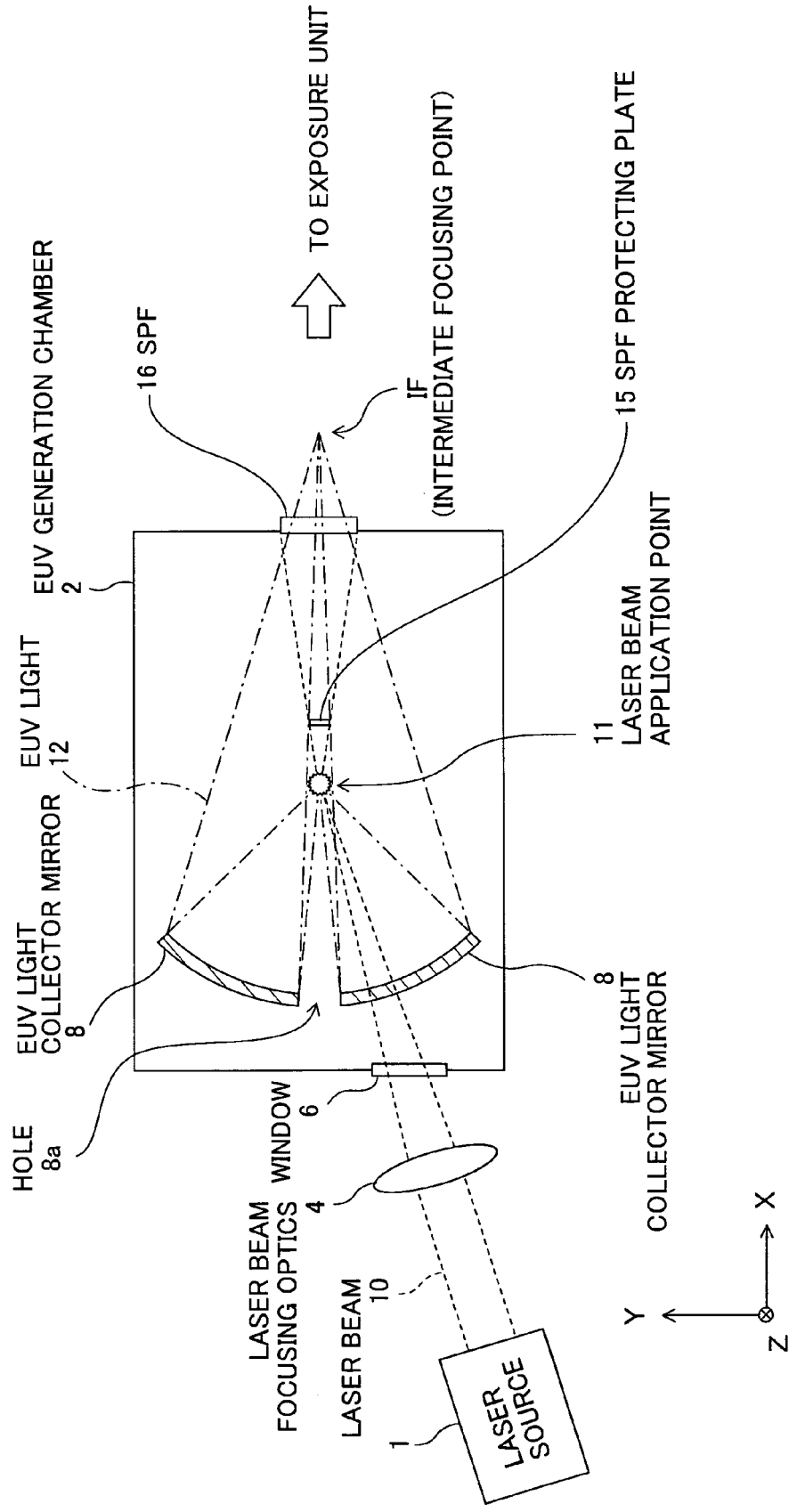
FIG. 6 is a schematic diagram showing a configuration of an LPP type EUV light source apparatus according to the third embodiment of the present invention.

FIG. 6 is a schematic diagram showing the EUV light source apparatus according to the third embodiment. In FIG. 6, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the third embodiment, an SPF 16 having a larger thickness and higher strength than the SPF 14 is provided in place of the SPF 14 in the above-explained EUV light source apparatus according to the first embodiment (see FIG. 2). Thereby, deterioration and/or breakage of the SPF 16 can be reduced.

Next, an EUV light source apparatus according to the fourth embodiment of the present invention will be explained.

Figure 7:
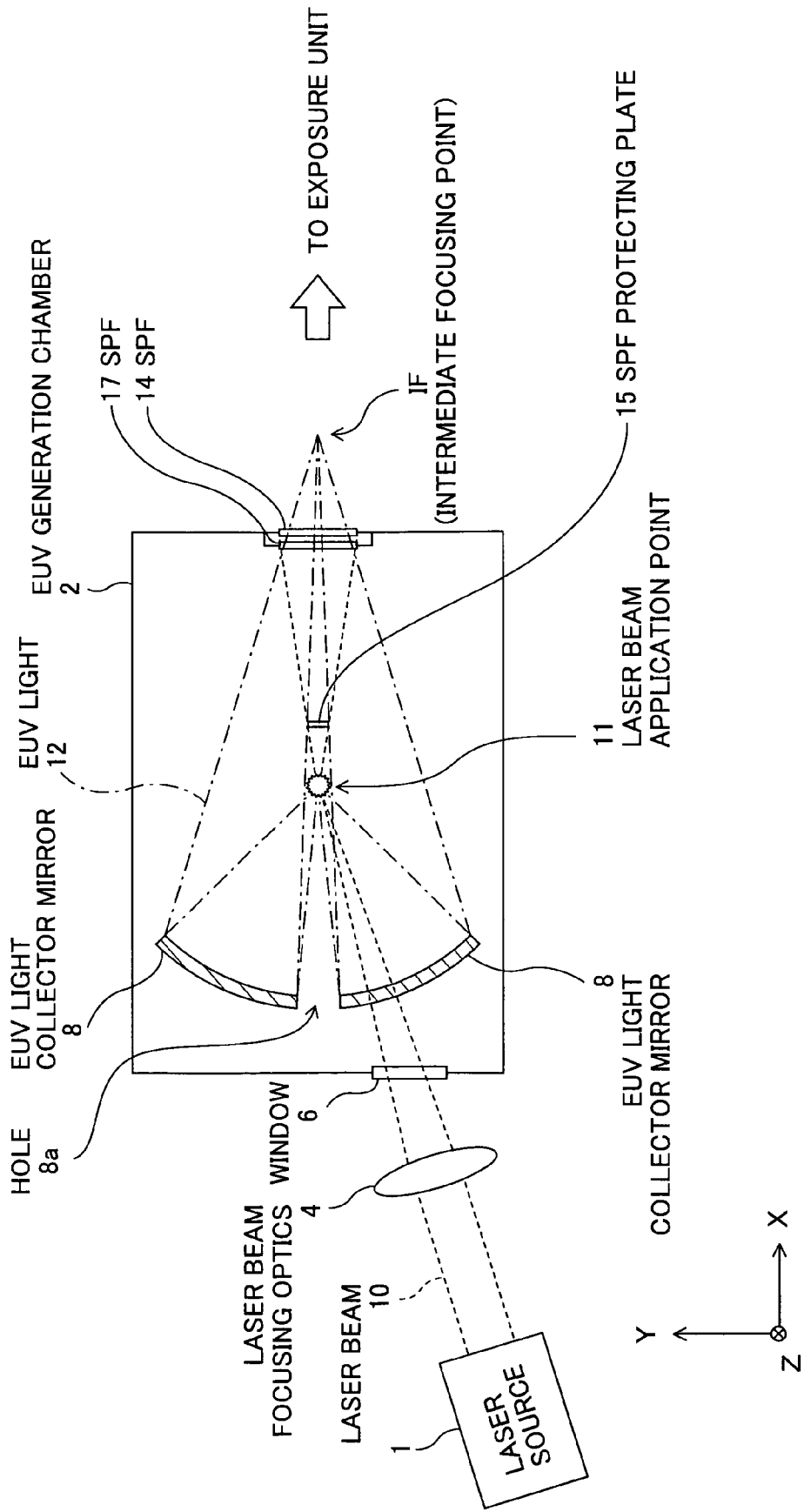
FIG. 7 is a schematic diagram showing a configuration of an LPP type EUV light source apparatus according to the fourth embodiment of the present invention.

FIG. 7 is a schematic diagram showing the EUV light source apparatus according to the fourth embodiment. In FIG. 7, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the fourth embodiment, another SPF 17 for protecting the SPF 14 is provided between the SPF protecting plate 15 and the SPF 14 in the above-explained EUV light source apparatus according to the first embodiment (see FIG. 2). By the SPF 17, the flying matter emitted from the plasma, which is reflected by the EUV generation chamber 2 and/or the member provided within the EUV generation chamber 2 and flies toward the SPF 14, can be blocked. Thereby, deterioration and/or breakage of the SPF 14 can be prevented even when the SPF 17 is deteriorated and/or broken.

In place of the SPF 17, a mesh (wire netting) may be provided. In the case where xenon (Xe) liquefied by cooling or the like is used as the target material, it is still more preferable that the mesh is heated by a heater or the like because the target material entering the mesh may be gasified.

Next, an EUV light source apparatus according to the fifth embodiment of the present invention will be explained.

Figure 8:
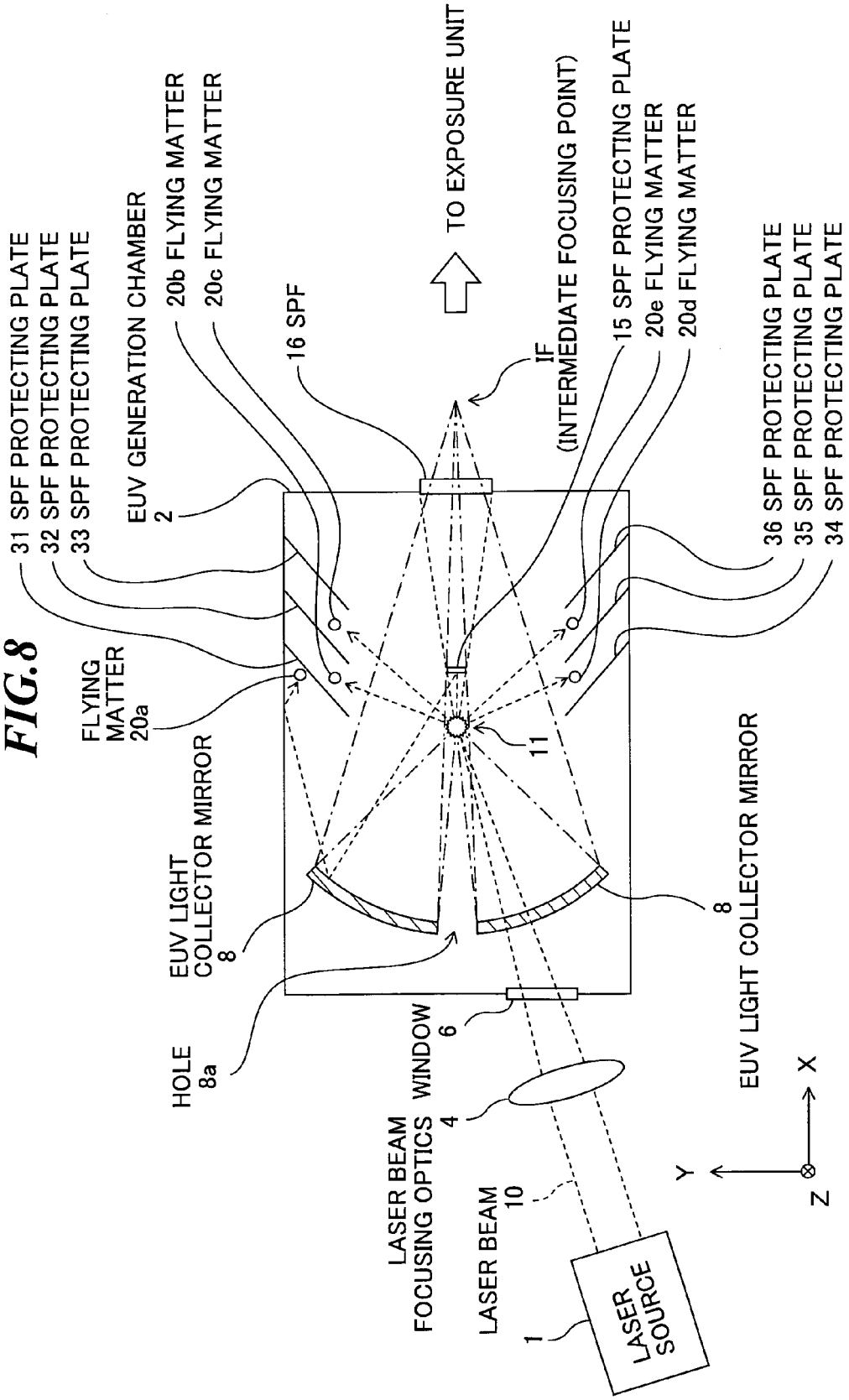
FIG. 8 is a schematic diagram showing a configuration of an LPP type EUV light source apparatus according to the fifth embodiment of the present invention.

FIG. 8 is a schematic diagram showing the EUV light source apparatus according to the fifth embodiment. In FIG. 8, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the fifth embodiment, SPF protecting plates 31-36 for protecting the SPF 16 by blocking the flying matter 20a-20e emitted from the plasma and/or emitted from the plasma and reflected by the EUV generation chamber 2 and/or the member provided within the EUV generation chamber 2 are provided on the inner wall of the EUV generation chamber 2 in the above explained EUV light source apparatus according to the third embodiment (see FIG. 6). The sizes, locations, positional angles of the SPF protecting plates 31-36 may be determined according to the design of the EUV light source apparatus. For example, as shown in FIG. 8, the SPF protecting plates 31-36 may be provided in the locations nearer the SPF 14 than the plasma generation position (laser beam application point 11) on the inner wall surface of the EUV generation chamber 2 at an inclination toward the plasma generation position. Further, a material that is hard to reflect the flying matter 20a-20e (e.g., a metal porous material or the like) may be attached to the surfaces of the SPF protecting plates 31-36 or the surfaces may be coated with the material.

Next, an EUV light source apparatus according to the sixth embodiment of the present invention will be explained.

Figure 9:
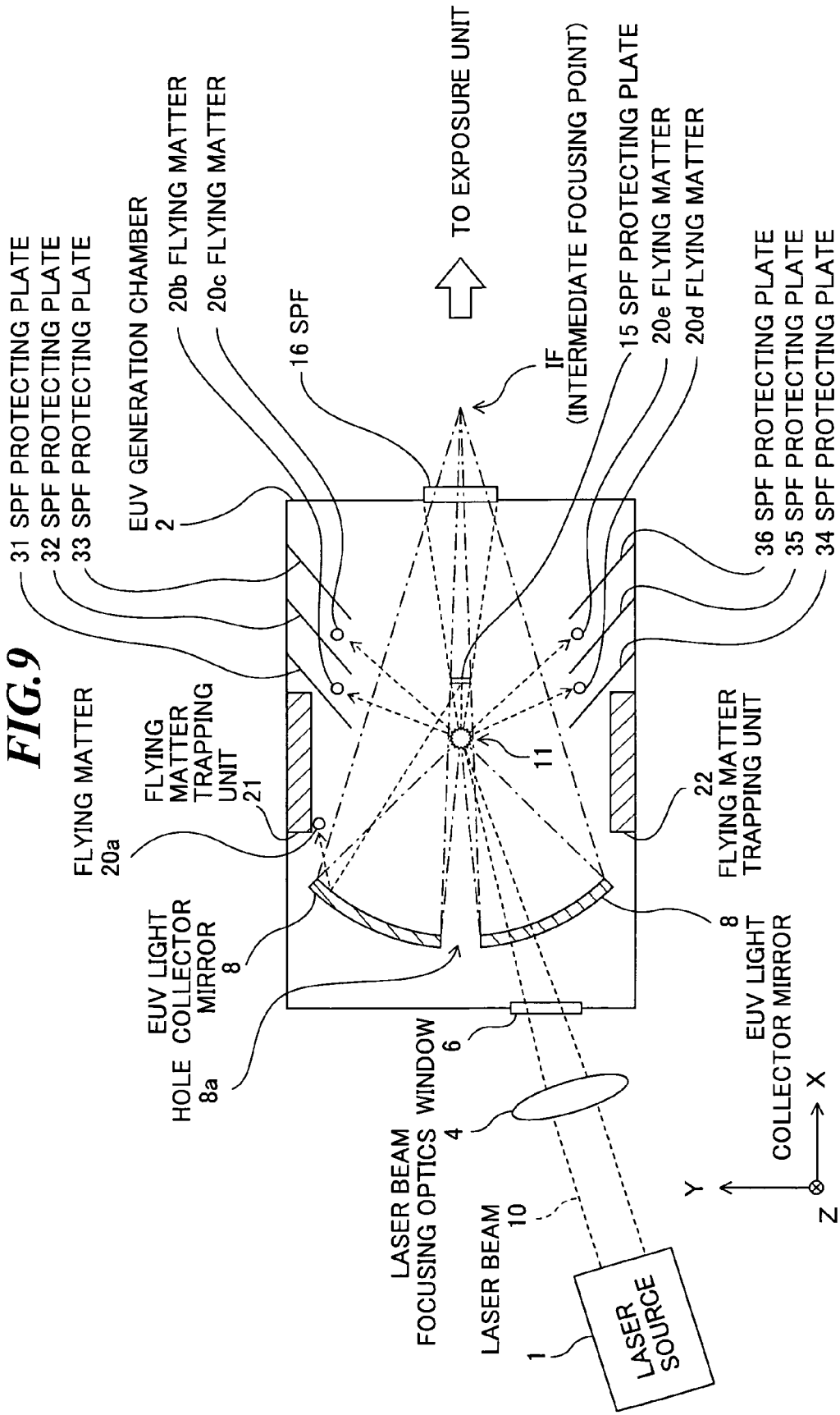
FIG. 9 is a schematic diagram showing a configuration of an LPP type EUV light source apparatus according to the sixth embodiment of the present invention.

FIG. 9 is a schematic diagram showing the EUV light source apparatus according to the sixth embodiment. In FIG. 9, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the sixth embodiment, flying matter trapping units 21 and 22 for trapping the flying matter emitted from the plasma and/or emitted from the plasma and reflected by the EUV generation chamber 2 and/or the member provided within the EUV generation chamber 2 are provided on the inner wall of the EUV generation chamber 2 in the above explained EUV light source apparatus according to the fifth embodiment (see FIG. 8). As each of the flying matter trapping units 21 and 22, for example, a metal porous material or the like may be used. In the case where xenon (Xe) liquefied by cooling or the like is used as the target material, it is still more preferable that the flying matter trapping units 21 and 22 are heated by a heater or the like because the target matter flying to the flying matter trapping units 21 and 22 may be gasified.

Next, an EUV light source apparatus according to the seventh embodiment of the present invention will be explained.

Figure 10:
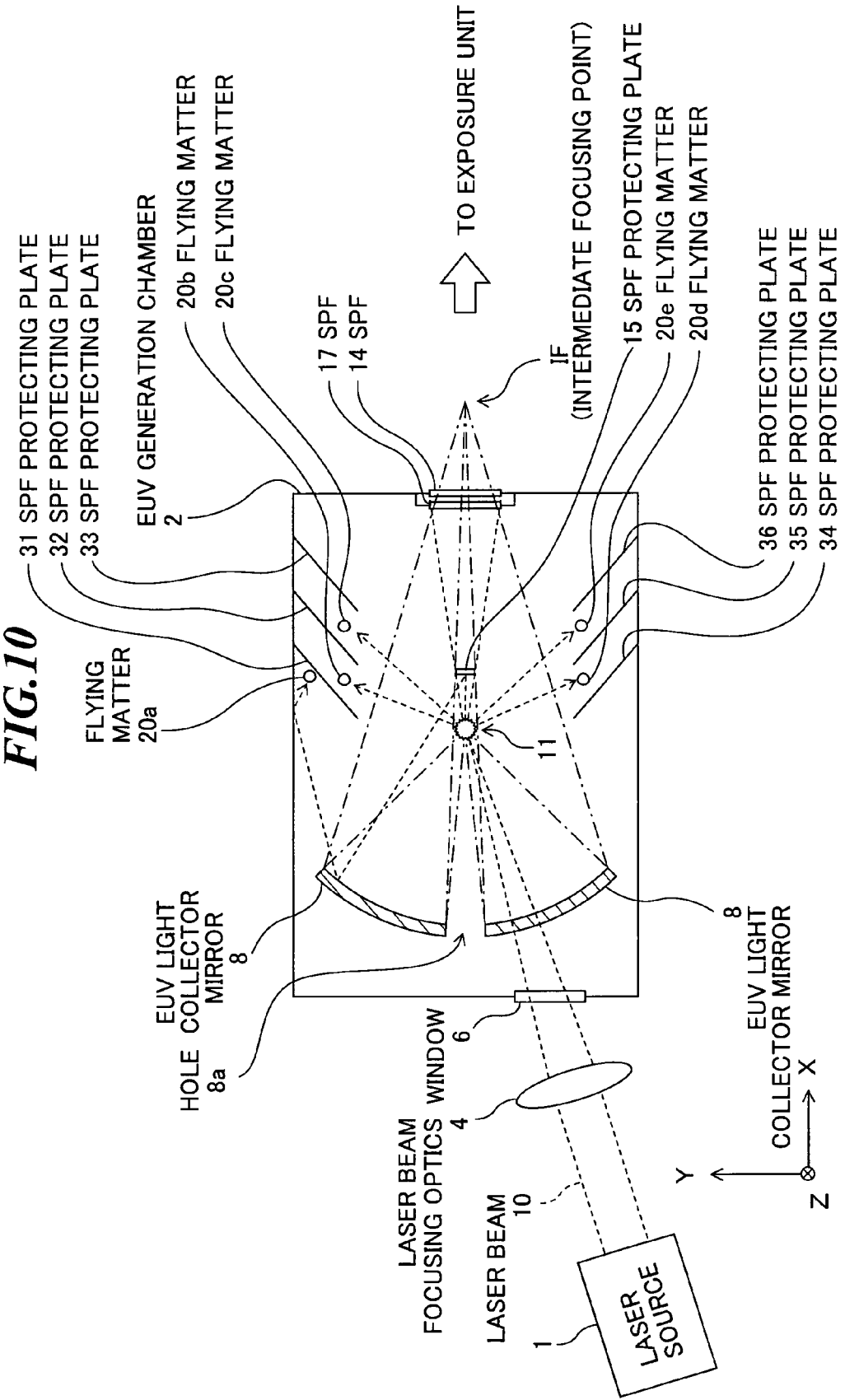
FIG. 10 is a schematic diagram showing a configuration of an LPP type EUV light source apparatus according to the seventh embodiment of the present invention.

FIG. 10 is a schematic diagram showing the EUV light source apparatus according to the seventh embodiment. In FIG. 10, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the seventh embodiment, SPFs 14 and 17 are provided in place of the SPF 16 in the above-explained EUV light source apparatus according to the fifth embodiment (see FIG. 8). In place of the SPF 17, a mesh (wire netting) may be provided.

Next, an EUV light source apparatus according to the eighth embodiment of the present invention will be explained.

Figure 11:
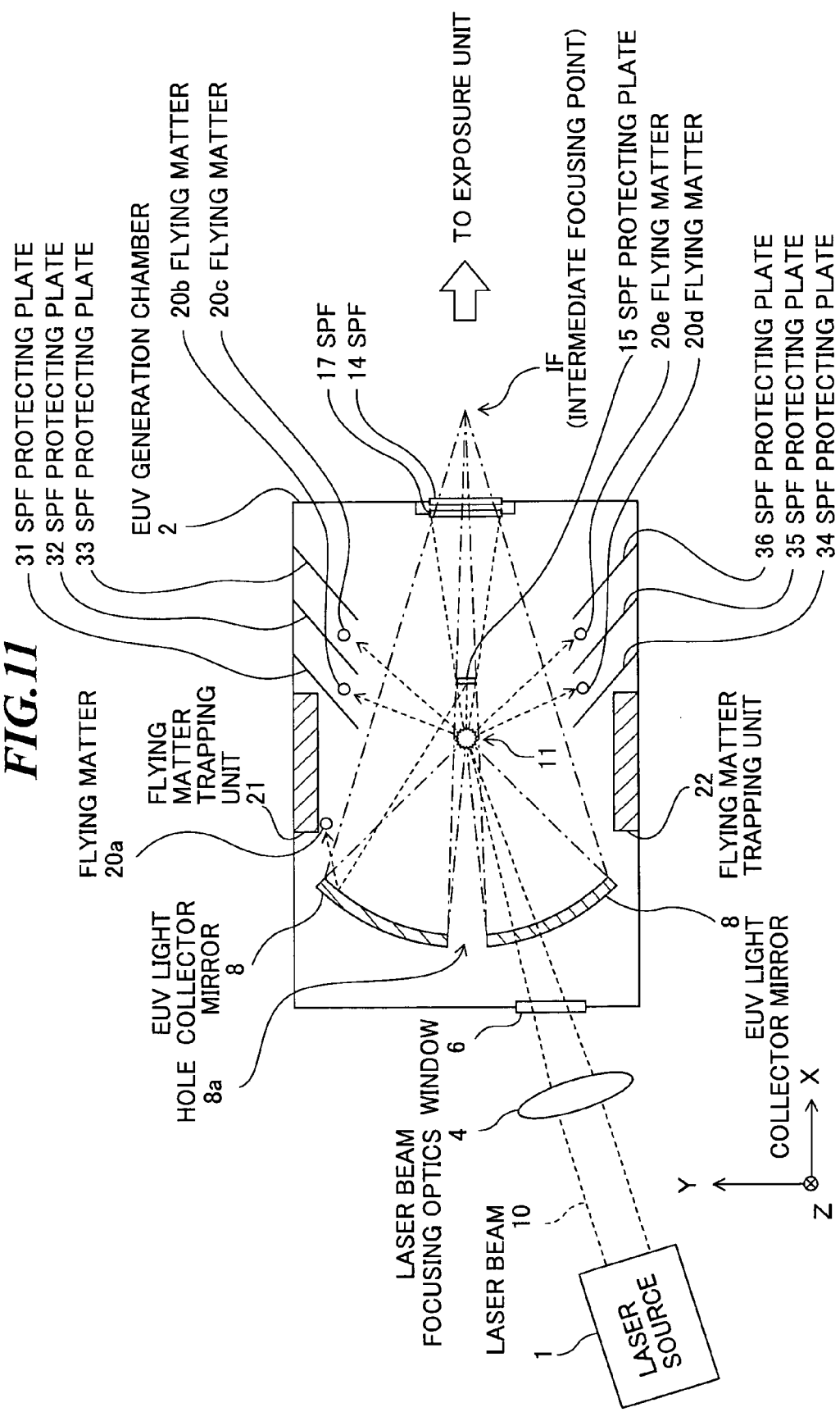
FIG. 11 is a schematic diagram showing a configuration of an LPP type EUV light source apparatus according to the eighth embodiment of the present invention.

FIG. 11 is a schematic diagram showing the EUV light source apparatus according to the eighth embodiment. In FIG. 11, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the eighth embodiment, SPFs 14 and 17 are provided in place of the SPF 16 in the above-explained EUV light source apparatus according to the sixth embodiment (see FIG. 9). In place of the SPF 17, a mesh (wire netting) may be provided.

Next, an EUV light source apparatus according to the ninth embodiment of the present invention will be explained.

Figure 12:
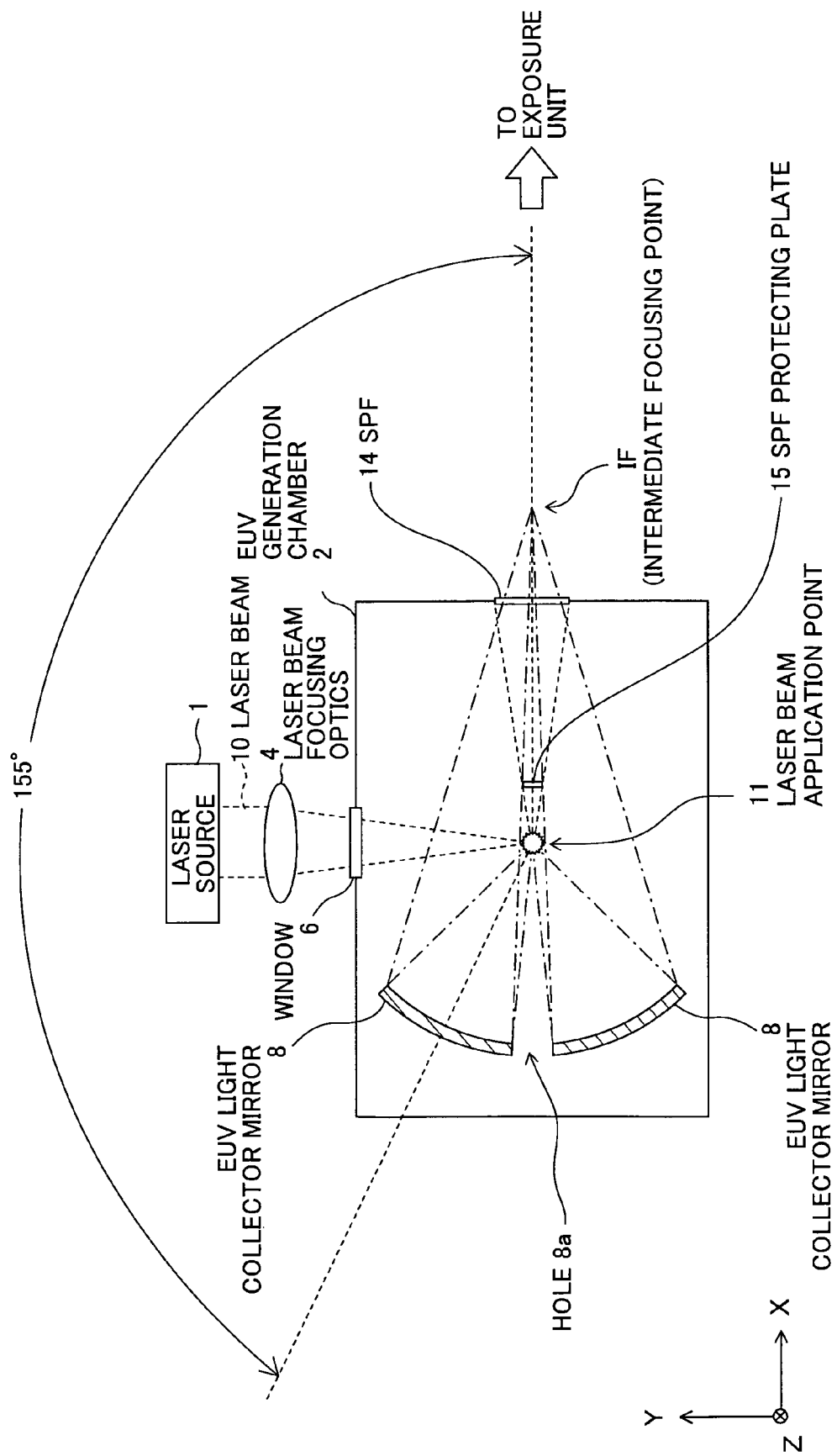
FIG. 12 is a schematic diagram showing a configuration of an LPP type EUV light source apparatus according to the ninth embodiment of the present invention.

FIG. 12 is a schematic diagram showing the EUV light source apparatus according to the ninth embodiment. In FIG. 12, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the ninth embodiment, the laser source 1 in the above explained EUV light source apparatus according to the first embodiment (see FIG. 2) is provided such that the angle formed by the line connecting the laser beam application point 11 and the SPF 14 and the optical axis of the laser beam 10 is within 155°.

The inventor has found that the deterioration and/or breakage of the SPF 14 can be prevented by providing the laser source 1 as shown in FIG. 12.

Figure 13:
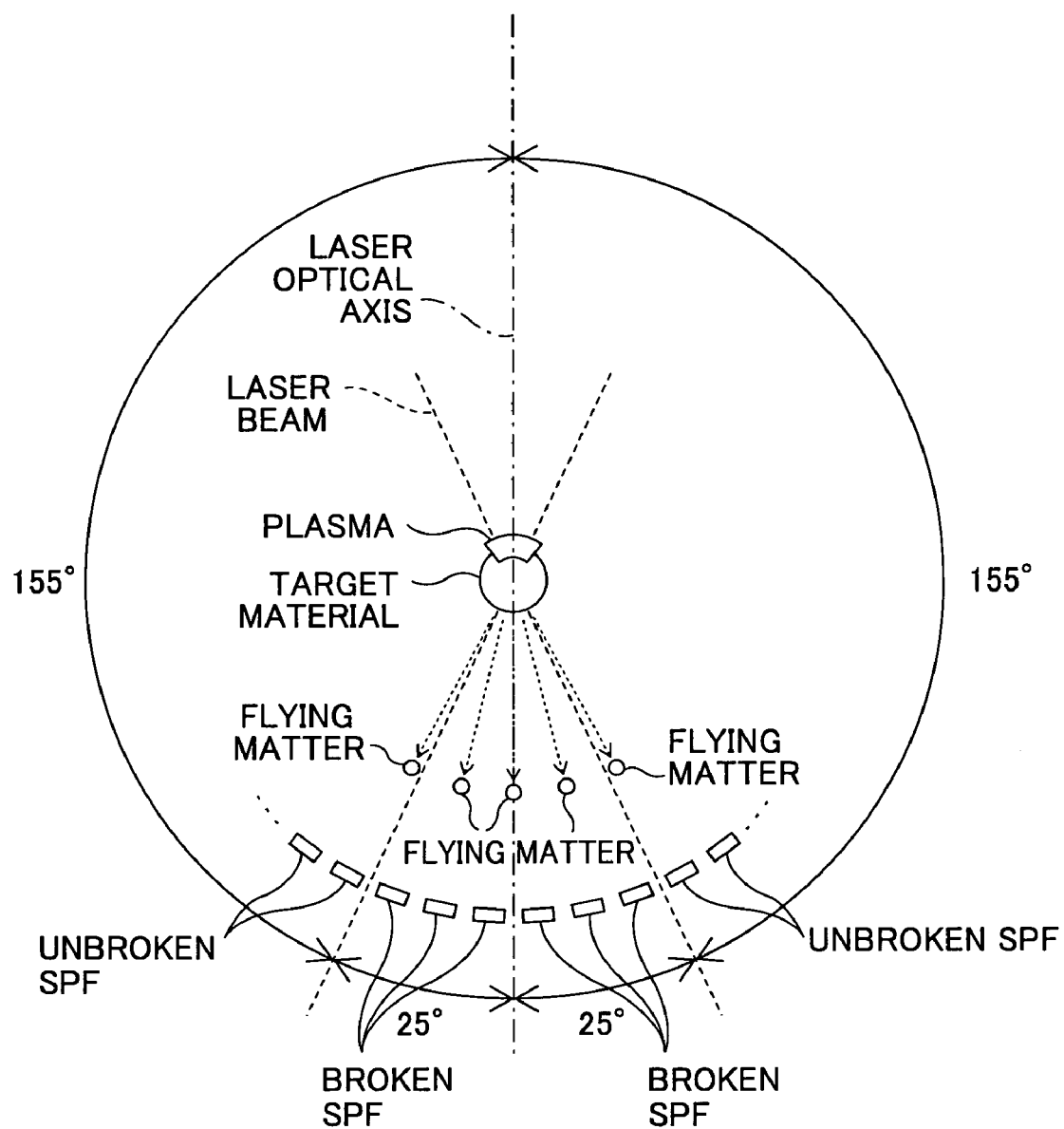
FIG. 13 is a schematic diagram showing an arrangement of SPFs to be broken by flying matter from plasma.

The inventor has found that, from the experiments in which many SPFs are located in the respective directions of the target material and the laser beam is entered into the target material as shown in FIG. 13, the SPFs located within the angle of ±25° from the traveling direction of the laser optical axis are deteriorated and/or broken, but the SPFs located outside the angle of ±25° from the traveling direction of the laser optical axis are not deteriorated nor broken. It is considered that this is because, as shown in FIG. 13, the part of the target material where the laser beam is applied (the upper part in the drawing) is plasmatized but the part where the laser beam is not applied (the lower part in the drawing) is not plasmatized, and the lower part of the target material in the drawing is scattered as flying matter along the traveling direction of the laser beam (the downward direction in the drawing) due to the impact of the plasmatization of the upper part of the target material in the drawing.

Therefore, the deterioration and/or breakage of the SPF 14 can be prevented by providing the laser source 1 such that the angle formed by the optical axis of the laser beam 10 and the line connecting the laser beam application point 11 and the SPF 14 is within 155° as shown in FIG. 12.

It is conceivable that the numeric value of 155° may change depending on the collection diameter (spot size) of the laser beam 10, N.A. (numerical aperture) of the laser beam focusing optics 4, and the size of the target material. For example, it is also conceivable that, when the collection diameter (spot size) of the laser beam 10 is sufficiently larger than the size of the target material, the laser source 1 may be located within the wider angle range.

Further, in order to prevent the breakage of the SPF 14 by reducing the impact of the flying matter, it is also effective that the SPF 14 is located far from the plasma generation position (laser beam application point 11) such that the distance from the plasma generation position (laser beam application point 11) to the SPF 14 is made longer.

Next, an EUV light source apparatus according to the tenth embodiment of the present invention will be explained.

Figure 14:
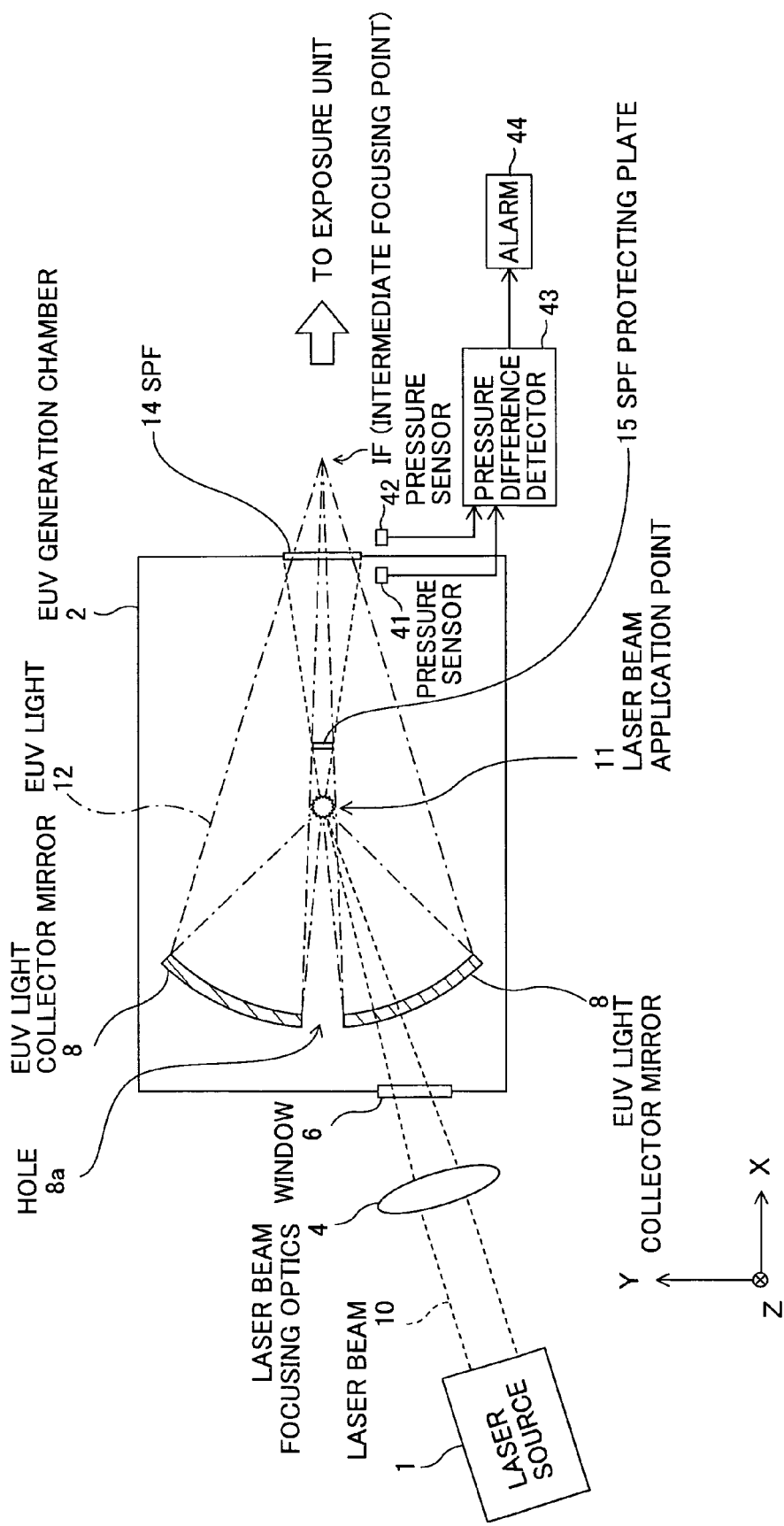
FIG. 14 is a schematic diagram showing a configuration of an LPP type EUV light source apparatus according to the tenth embodiment of the present invention.

FIG. 14 is a schematic diagram showing the EUV light source apparatus according to the tenth embodiment. In FIG. 14, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

The tenth embodiment is additionally provided with pressure sensors 41 and 42, a pressure difference detector 43, and an alarm 44 in the above explained EUV light source apparatus according to the first embodiment (see FIG. 2).

The pressure sensor 41 is provided within the EUV generation chamber 2, and outputs a pressure measurement signal representing the pressure of the atmosphere at the EUV generation chamber 2 side of the SPF 14 to the pressure difference detector 43.

The pressure sensor 42 outputs a pressure measurement signal representing the pressure of the atmosphere at the exposure unit side of the SPF 14 to the pressure difference detector 43.

Generally, the pressure of the atmosphere within the EUV generation chamber 2 is about 1 Pa, and the pressure of the atmosphere at the exposure unit side of the SPF 14 is lower than that. Accordingly, the pressure difference detector 43 judges that the SPF 14 has not been deteriorated nor broken when the difference between the pressure represented by the pressure measurement signal from the pressure sensor 41 and the pressure represented by the pressure measurement signal from the pressure sensor 42 is equal to or more than a predetermined threshold value. On the other hand, the pressure difference detector 43 judges that the SPF 14 has been deteriorated and/or broken and the gas within the EUV generation chamber 2 passes through the SPF 14 and leaks to the exposure unit side when the difference between the pressure represented by the pressure measurement signal from the pressure sensor 41 and the pressure represented by the pressure measurement signal from the pressure sensor 42 is less than the predetermined threshold value, and then drives the alarm 44. Thereby, a user can know that the SPF 14 has been deteriorated and/or broken early, and replace the SPF 14.

Next, an EUV light source apparatus according to the eleventh embodiment of the present invention will be explained.

Figure 15:
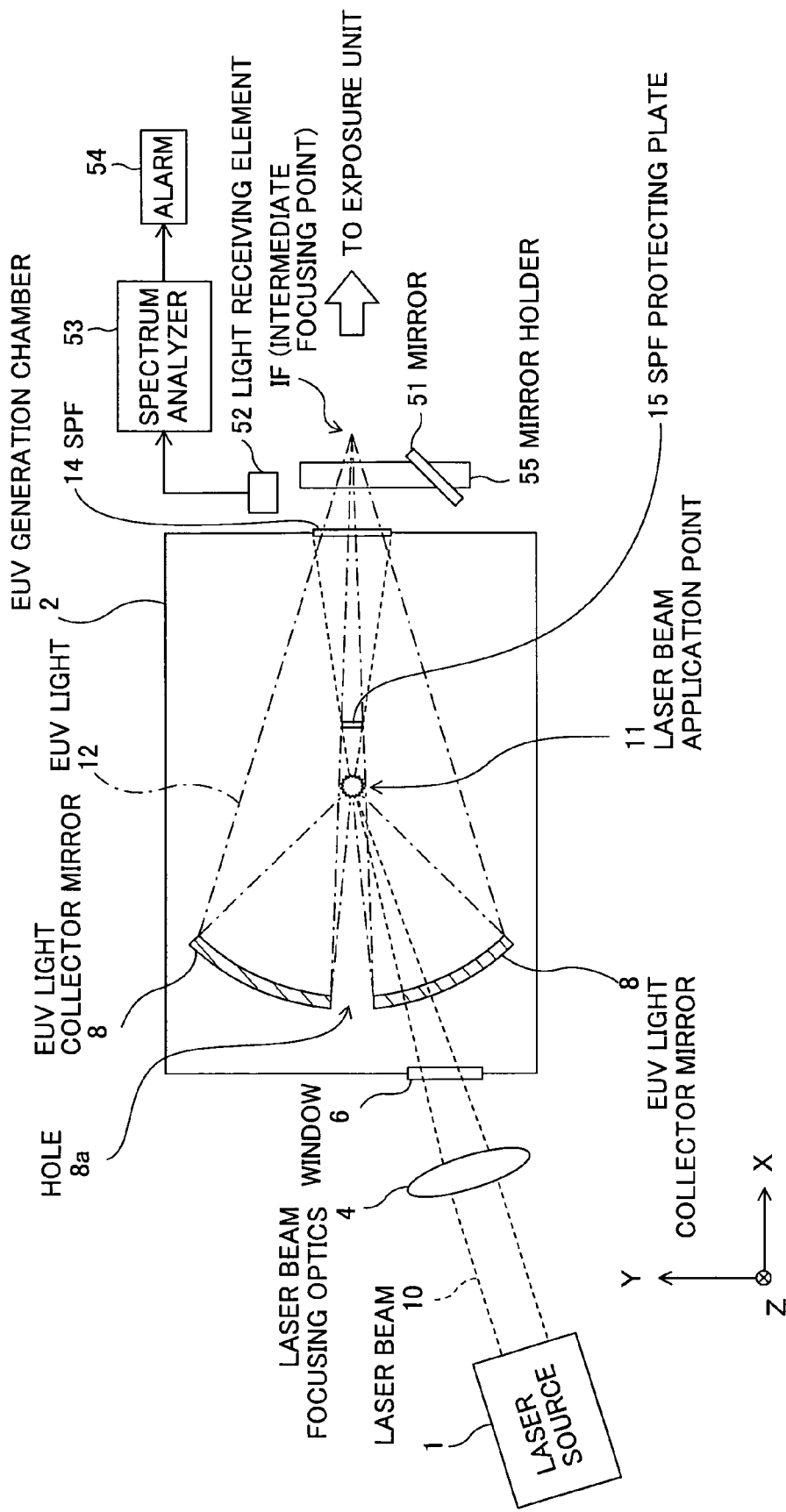
FIG. 15 is a schematic diagram showing a configuration of an LPP type EUV light source apparatus according to the eleventh embodiment of the present invention.
Figure 16:
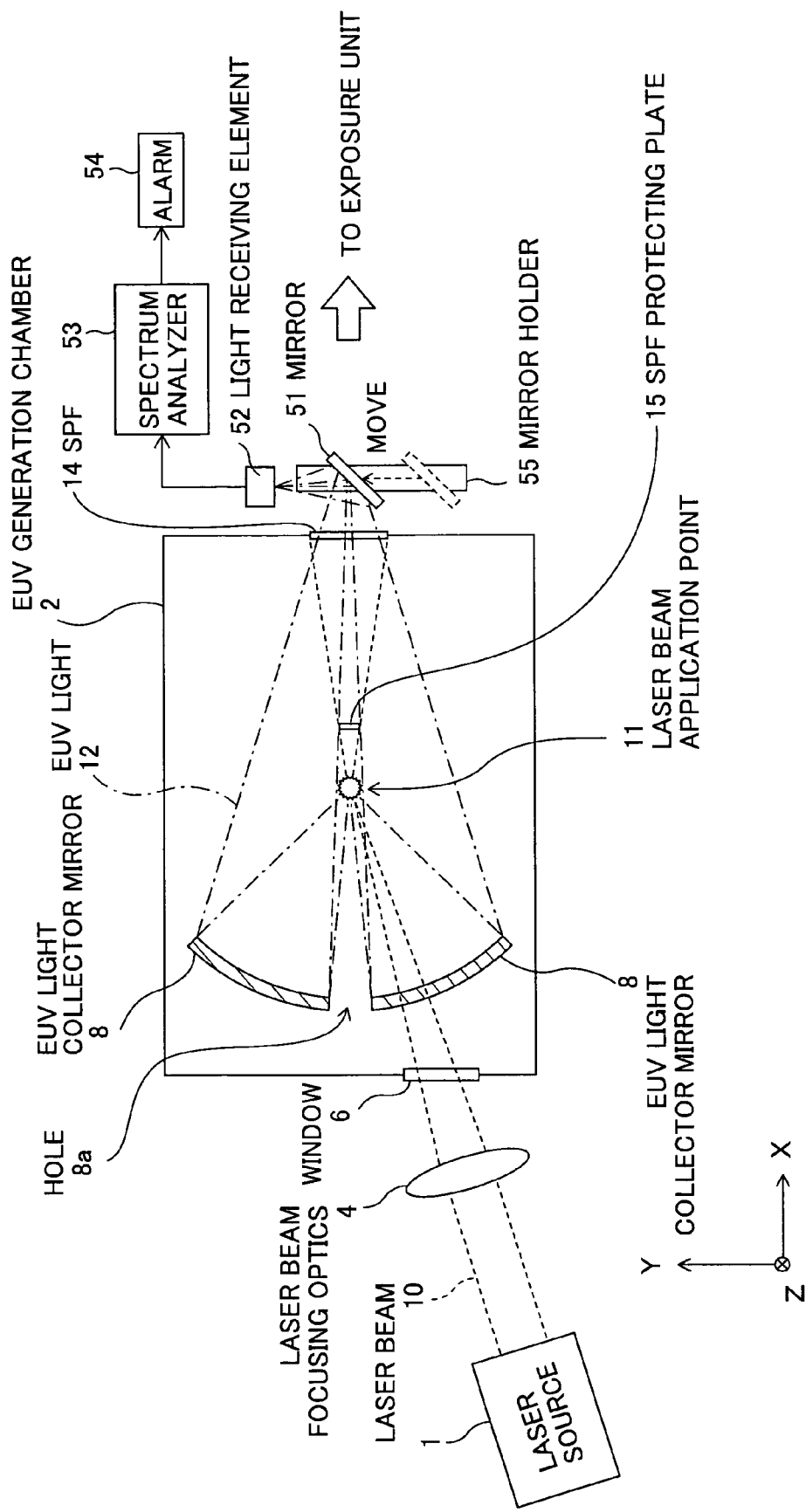
FIG. 16 is a schematic diagram showing the configuration of the LPP type EUV light source apparatus according to the eleventh embodiment of the present invention.

FIGS. 15 and 16 are schematic diagrams showing the EUV light source apparatus according to the eleventh embodiment. In FIGS. 15 and 16, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the eleventh embodiment, a mirror 51, a light receiving element 52, a spectrum analyzer 53, an alarm 54, and a mirror holder 55 are provided in place of the pressure sensors 41 and 42, the pressure difference detector 43, and the alarm 44 in the above explained EUV light source apparatus according to the tenth embodiment (see FIG. 14).

The mirror holder 55 supports the mirror 51 in a position outside of the optical path of the EUV light 12 (see FIG. 15) at the time of normal operation (e.g., at the time of exposure or the like) of the EUV light source apparatus, and slides the mirror 15 into the optical path of the EUV light 12 (see FIG. 16) at the time of inspection of the SPF 14. The inspection of the SPF 14 may be performed once per a predetermined number of shots (EUV light emissions).

The light receiving element 52 is, for example, a light receiving diode or the like, and receives, when the mirror 51 is located within the optical path of the EUV light 12, the EUV light 12 reflected by the mirror 51 and outputs to the spectrum analyzer 53 a measurement signal representing at least the intensity of electromagnetic wave or light having a shorter wavelength than EUV light and/or light having a longer wavelength than EUV light (e.g., ultraviolet light, visible light, infrared light, or the like) other than the light having a desired wavelength (e.g., 13.5 nm). The light receiving element 52 may output a measurement signal representing intensity of the light having a desired wavelength (e.g., 13.5 nm) in addition to the intensity of electromagnetic wave or light having a wavelength other than the desired wavelength or light.

Generally, when the SPF 14 is deteriorated and/or broken, the SPF allows electromagnetic wave or light having a shorter wavelength than EUV light and/or light having a longer wavelength than EUV light (e.g., ultraviolet light, visible light, infrared light, or the like) other than the light having a desired wavelength (e.g., 13.5 nm) to pass through. Accordingly, the spectrum analyzer 53 judges that the SPF 14 has been deteriorated and/or broken when electromagnetic wave or light having a wavelength other than the desired wavelength and having intensity equal to or more than a predetermined threshold value passes through the SPF 14, and drives the alarm 54. Thereby, a user can know that the SPF 14 has been deteriorated and/or broken early, and replace the SPF 14.

Next, an EUV light source apparatus according to the twelfth embodiment of the present invention will be explained.

Figure 17:
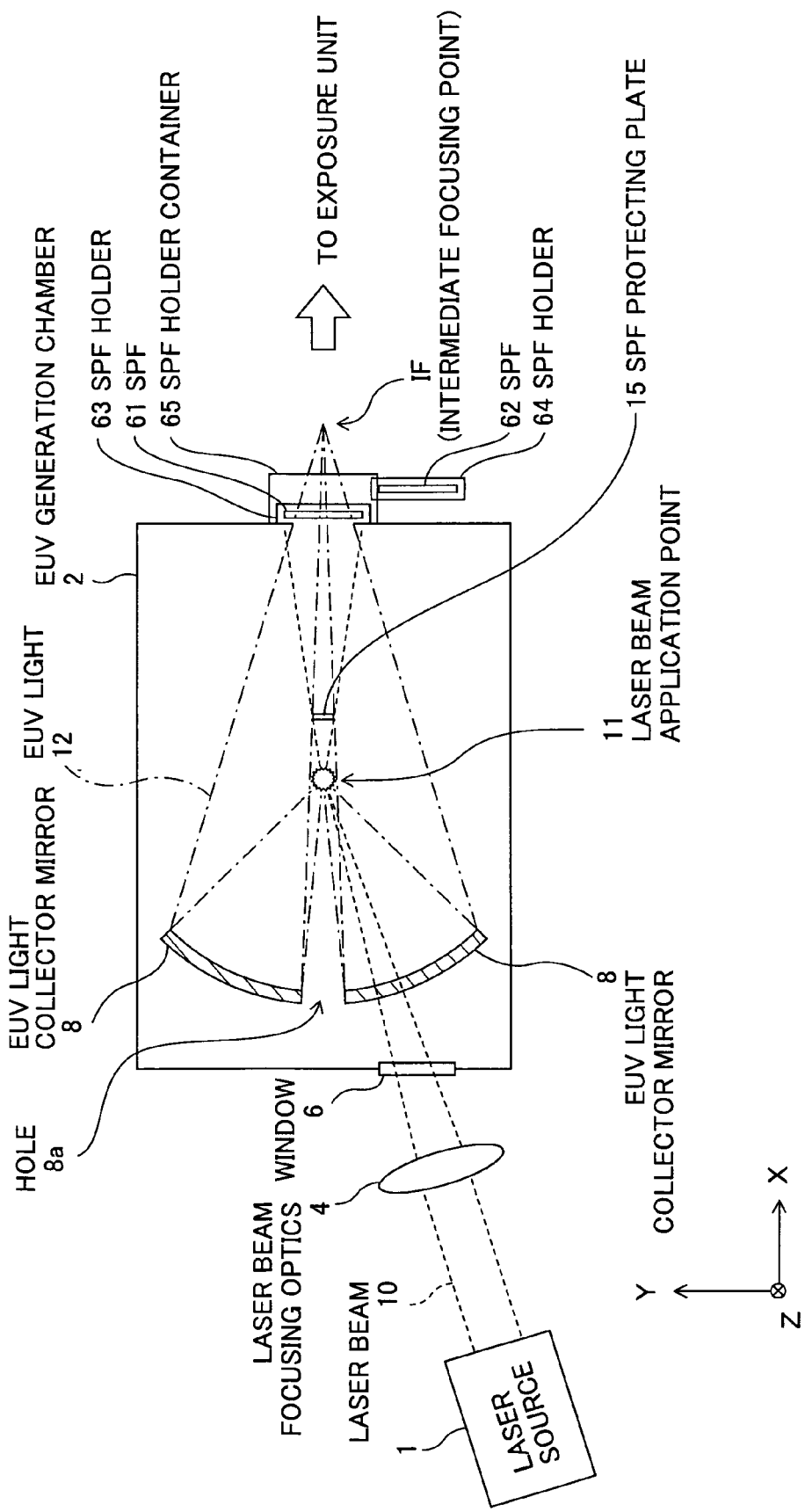
FIG. 17 is a schematic diagram showing a configuration of an LPP type EUV light source apparatus according to the twelfth embodiment of the present invention.
Figure 18:
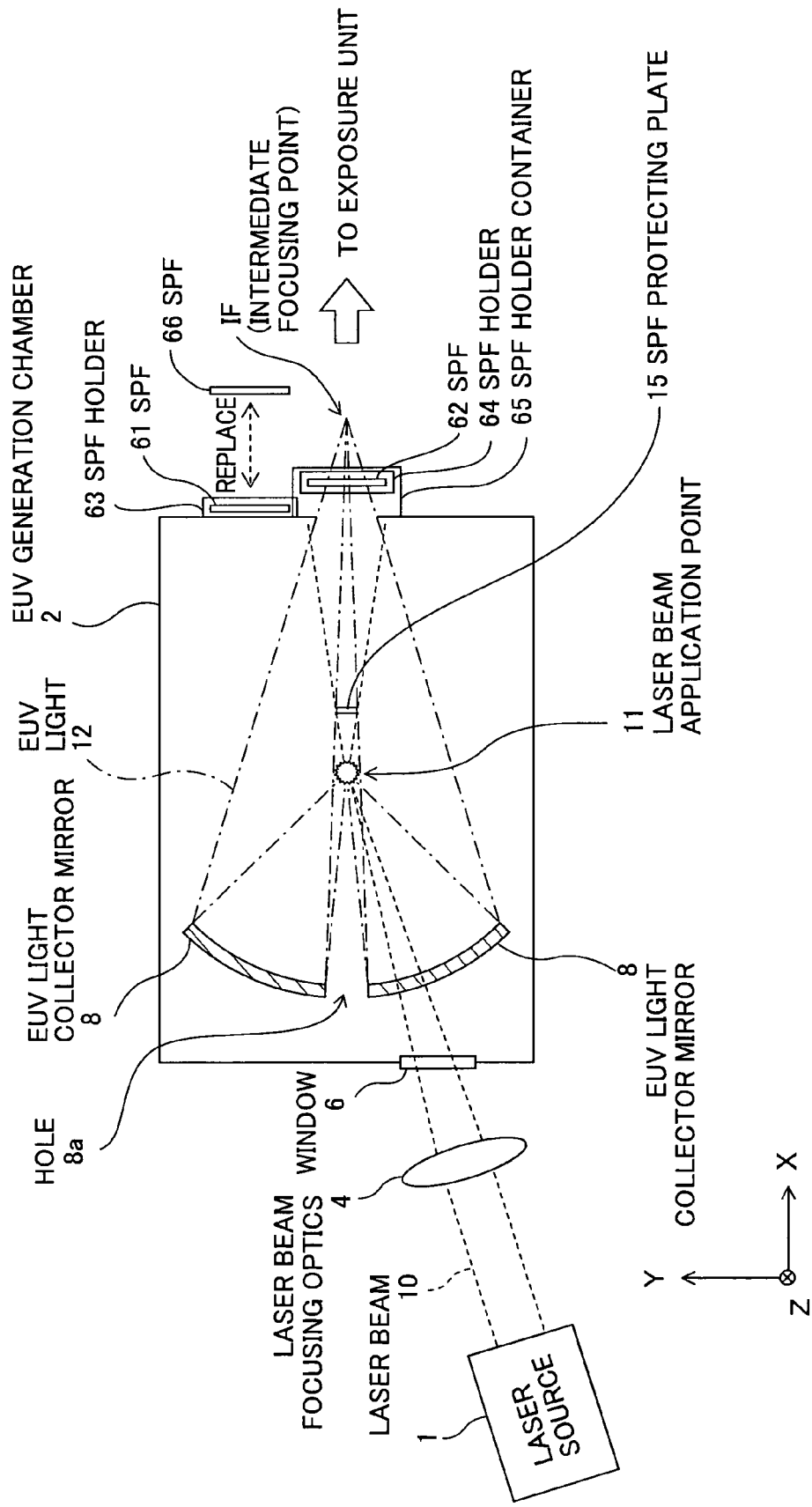
FIG. 18 is a schematic diagram showing the configuration of the LPP type EUV light source apparatus according to the twelfth embodiment of the present invention.

FIGS. 17 and 18 are schematic diagrams showing the EUV light source apparatus according to the twelfth embodiment. In FIGS. 17 and 18, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the twelfth embodiment, two SPFs 61 and 62, SPF holders 63 and 64 for supporting the SPFs 61 and 62, respectively, and an SPF holder container 65 for containing the SPF holders 63 and 64 slidably in the direction intersecting the EUV light 12 are further provided in the above explained EUV light source apparatus according to the first embodiment (see FIG. 2).

In FIG. 17, the SPF holder 63 is located on the optical path of the EUV light 12, and the SPF 61 filters the EUV light 12. Here, when the SPF 61 is deteriorated and/or broken, the SPF holder 63 is slid in the upward direction in the drawing, and the SPF holder 64 is slid in the upward direction in the drawing (see FIG. 18). Thereby, the SPF holder 64 is located on the optical path of the EUV light 12, and the SPF 62 filters the EUV light 12. During the filtration, the SPF 61 that has been deteriorated and/or broken and is not used for filtration of the EUV light 12 can be replaced by a new SPF 66.

Then, when the SPF 62 is deteriorated and/or broken, the SPF holder 64 is slid in the downward direction in the drawing, and the SPF holder 63 is slid in the downward direction in the drawing. Thereby, the SPF holder 63 is located on the optical path of the EUV light 12, and the SPF 66 filters the EUV light 12. During the filtration, the SPF 62 that has been deteriorated and/or broken and is not used for filtration of the EUV light 12 can be replaced by a new SPF.

According to the embodiment, even when the SPF 61 or 62 is deteriorated and/or broken, the deteriorated and/or broken SPF can be replaced by a new SPF without stopping the operation of the EUV light source apparatus.

In order to detect the deterioration and/or breakage of the SPF 61 and 62, the pressure sensors 41 and 42, the pressure difference detector 43, and the alarm 44 in the above explained EUV light source apparatus according to the tenth embodiment (see FIG. 14) may be used, or the mirror 51, the light receiving element 52, the spectrum analyzer 53, the alarm 54, and the mirror holder 55 in the above explained EUV light source apparatus according to the eleventh embodiment (see FIGS. 15 and 16) may be used.

Next, an EUV light source apparatus according to the thirteenth embodiment of the present invention will be explained.

Figure 19:
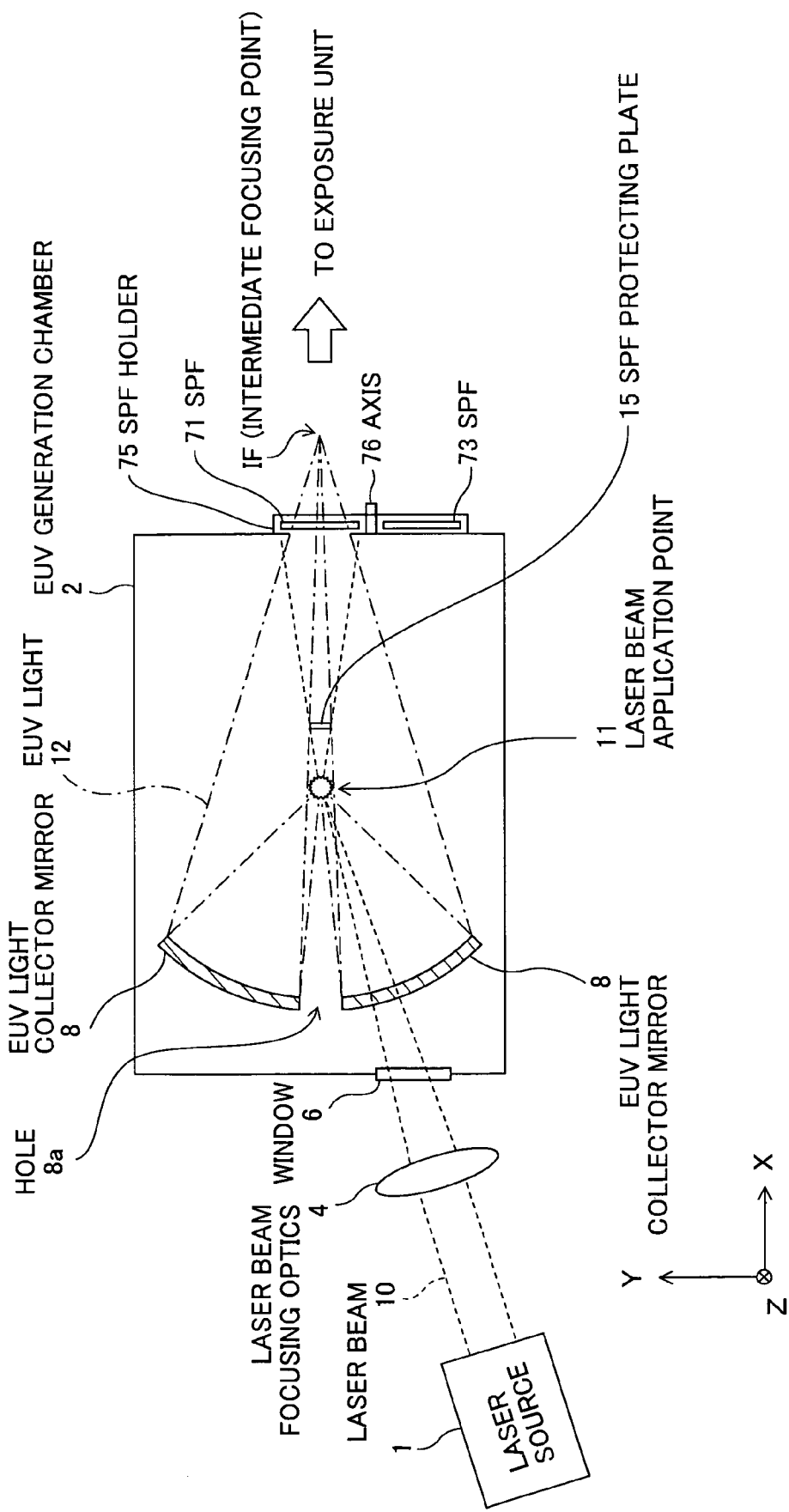
FIG. 19 is a schematic diagram showing a configuration of an LPP type EUV light source apparatus according to the thirteenth embodiment of the present invention.

FIG. 19 is a schematic diagram showing the EUV light source apparatus according to the thirteenth embodiment. In FIG. 19, the target material supply unit 3, the target material collecting tube 7, the gate valve 13, and the SPF protecting plate supporting member 16 (see FIG. 1) are omitted, and it is assumed that the target material is injected perpendicularly to the paper surface of the drawing.

In the thirteenth embodiment, four SPFs 71-74 (see FIG. 20) and an SPF holder 75 for supporting the SPFs 71-74 are provided in place of the SPFs 61 and 62, the SPF holders 63 and 64, and the SPF holder container 65 in the above explained EUV light source apparatus according to the twelfth embodiment (see FIG. 18).

Figure 20:
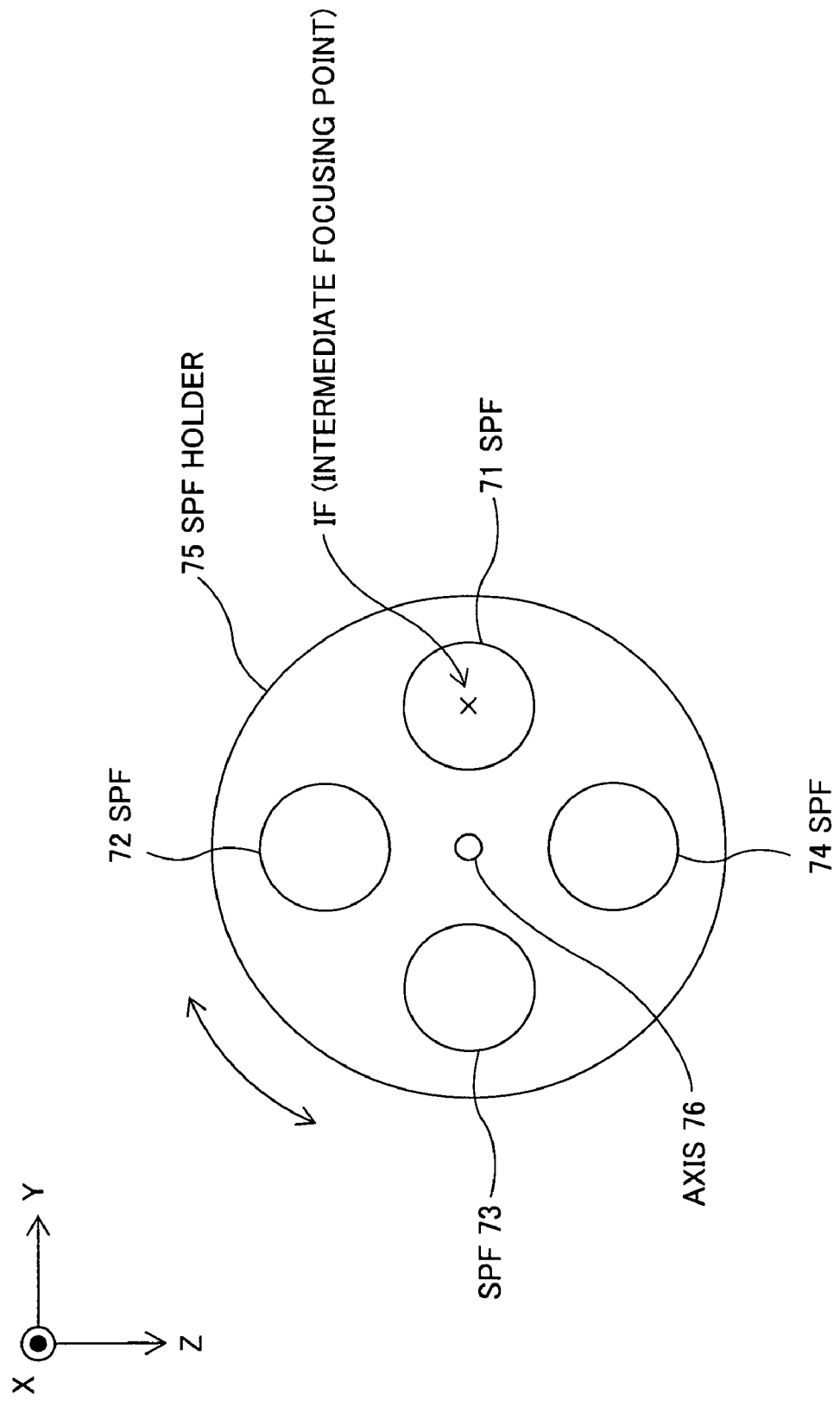
FIG. 20 is a schematic diagram showing the configuration of the LPP type EUV light source apparatus according to the thirteenth embodiment of the present invention.
Figure 21:
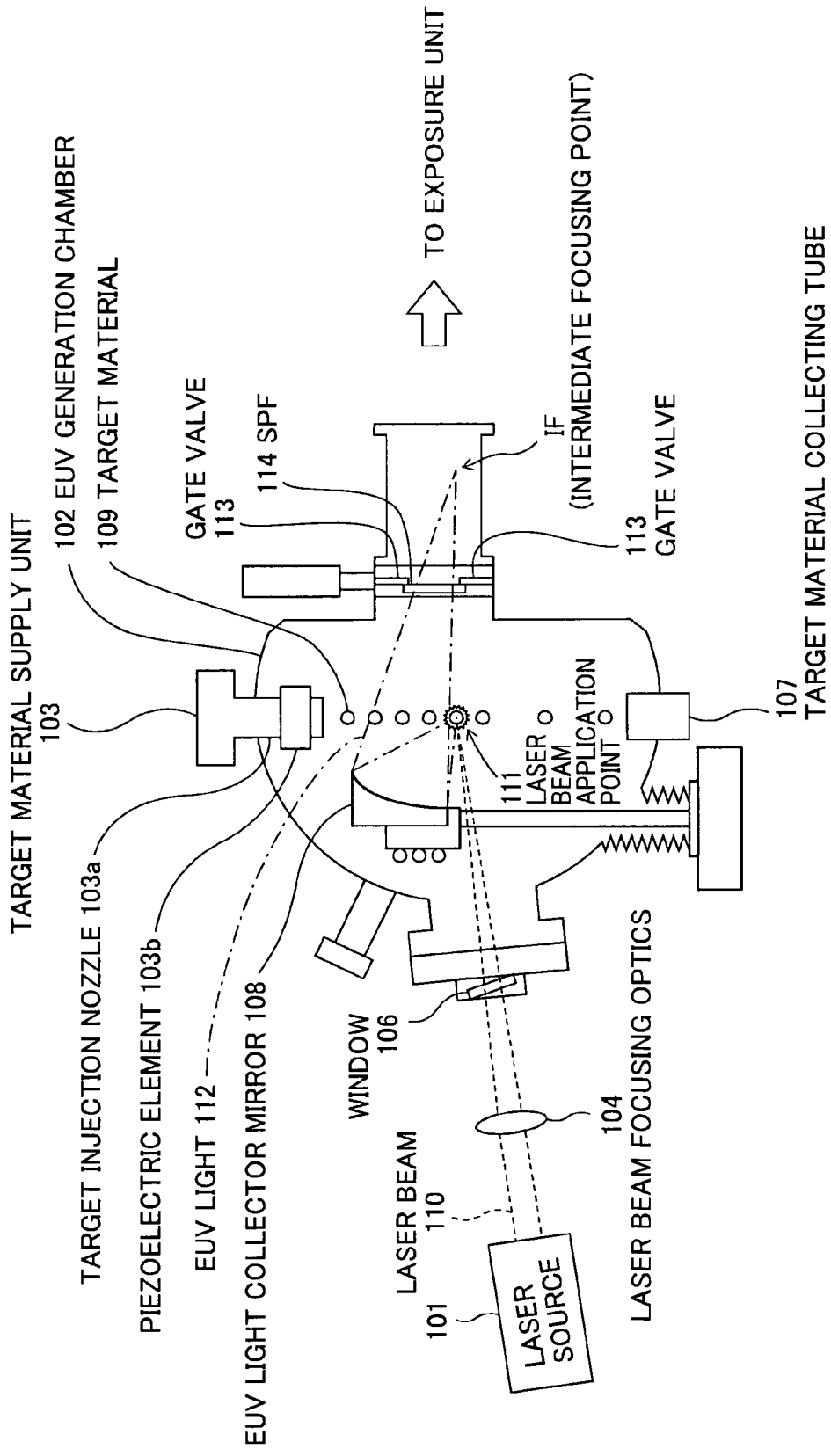
FIG. 21 is a schematic diagram showing a configuration of a general LPP type EUV light source apparatus.

FIG. 20 is a schematic diagram showing the SPF holder 75 shown in FIG. 19 from the opposite direction to the X-axis direction. The SPF holder 75 has a disk shape around an axis 76, and supports the SPF 71-74 at equal distances from the axis 76. Further, the SPF holder 75 is attached to the EUV generation chamber 2 rotatably around the axis 76.

In FIG. 20, the SPF 71 is located on the optical path of the EUV light 12, and the SPF 71 filters the EUV light 12. Here, when the SPF 71 is deteriorated and/or broken, the SPF holder 75 is rotated in the clockwise direction or the counter-clockwise direction in the drawing. Thereby, the SPF 72 is located on the optical path of the EUV light 12, and the SPF 72 filters the EUV light 12. During the filtration, the SPF 71 that has been deteriorated and/or broken and is not used for filtration of the EUV light 12 can be replaced by a new SPF.

Then, when the SPF 72 is deteriorated and/or broken, the SPF holder 75 is rotated in the clockwise direction or the counter-clockwise direction in the drawing. Thereby, the SPF 73 is located on the optical path of the EUV light 12, and the SPF 72 filters the EUV light 12. During the filtration, the SPF 72 that has been deteriorated and/or broken and is not used for filtration of the EUV light 12 can be replaced by a new SPF.

According to the embodiment, even when one of the SPF 71-74 is deteriorated and/or broken, the deteriorated and/or broken SPF can be replaced by a new SPF without stopping the operation of the EUV light source apparatus.

In order to detect the deterioration and/or breakage of the SPFs 71-74, the pressure sensors 41 and 42, the pressure difference detector 43, and the alarm 44 in the above explained EUV light source apparatus according to the tenth embodiment (see FIG. 14) may be used, or the mirror 51, the light receiving element 52, the spectrum analyzer 53, the alarm 54, and the mirror holder 55 in the above explained EUV light source apparatus according to the eleventh embodiment (see FIGS. 15 and 16) may be used.

The invention claimed is:

1. An extreme ultra violet light source apparatus for generating extreme ultra violet light by applying a laser beam to a target material, said apparatus comprising:
   an extreme ultra violet light generation chamber in which extreme ultra violet light is generated;
   a target material supply unit which supplies a target material into said extreme ultra violet light generation chamber;
   a laser source which applies a laser beam to the target material supplied into said extreme ultra violet light generation chamber to generate plasma;
   collection optics which collects extreme ultra violet light radiated from said plasma;
   a filter which filters the extreme ultra violet light collected by said collection optics; and
   a filter protecting member which is provided between said plasma and said filter, and which protects said filter by blocking flying matter flying from said plasma toward said filter, said filter protecting member having a size and being located such that said filter is substantially contained within a hypothetical cone defined by side ends of said filter protecting member with a plasma generation position as an apex.

2. The extreme ultra violet light source apparatus according to claim 1, wherein a surface of said filter protecting member is substantially orthogonal to a line connecting said plasma and said filter.

3. The extreme ultra violet light source apparatus according to claim 1, wherein a surface of said filter protecting member forms a predetermined angle θ with a surface orthogonal to a line connecting said plasma and said filter, where 0°<θ<90°.

4. The extreme ultra violet light source apparatus according to claim 1, further comprising:
   at least one flying matter trapping unit which is provided on an inner wall of said extreme ultra violet light generation chamber, and which traps the flying matter emitted from said plasma.

5. The extreme ultra violet light source apparatus according to claim 1, wherein said filter protecting member is a first filter protecting member, the extreme ultra violet light source apparatus further comprising:
   a second filter protecting member which is provided between said first filter protecting member and said filter, and which protects said filter by blocking the flying matter flying from said plasma toward said filter.

6. The extreme ultra violet light source apparatus according to claim 5, wherein said second filter protecting member includes at least one of a second filter and a mesh.

7. The extreme ultra violet light source apparatus according to claim 5, further comprising:
   a third filter protecting member which is provided on an inner wall of said extreme ultra violet light generation chamber, and which protects said filter by blocking the flying matter emitted from said plasma.

8. The extreme ultra violet light source apparatus according to claim 1, further comprising:
   means for judging that said filter has been deteriorated and/or broken when a difference between a pressure of an atmosphere at said extreme ultra violet light generation chamber side of said filter and a pressure of an atmosphere at the other side of said filter is not larger than a predetermined threshold value.

9. The extreme ultra violet light source apparatus according to claim 1, further comprising:
   means for judging that said filter has been deteriorated and/or broken when the EUV light that has passed through said filter includes light at an unwanted wavelength having intensity not less than a predetermined threshold value.

10. The extreme ultra violet light source apparatus according to claim 1, further comprising:
    a filter supporting member which supports a plurality of filters such that, while one of said plurality of filters filters the extreme ultra violet light collected by said collection optics, another of said plurality of filters can be replaced.

11. The extreme ultra violet light source apparatus according to claim 10, wherein said filter supporting member includes:
    a plurality of holders for supporting said plurality of filters, respectively; and
    a holder container for containing said plurality of holders movably to the inside and outside of an optical path of the extreme ultra violet light.

12. The extreme ultra violet light source apparatus according to claim 10, wherein said filter supporting member includes a holder which is rotatable around an axis, and which supports said plurality of filters in plural positions around said axis.

13. An extreme ultra violet light source apparatus for generating extreme ultra violet light by applying a laser beam to a target material, said apparatus comprising:
    an extreme ultra violet light generation chamber in which extreme ultra violet light is generated;
    a target material supply unit which supplies a target material into said extreme ultra violet light generation chamber;
    a laser source which applies a laser beam to the target material supplied into said extreme ultra violet light generation chamber to generate plasma at a laser beam application point;
    a collector mirror which collects extreme ultra violet light, which is radiated from said plasma, toward an intermediate focusing point, said collector mirror having a hole near a center thereof;
    a filter which filters the extreme ultra violet light collected by said collector mirror; and
    a filter protecting member which is provided between said plasma and said filter, and which protects said filter by blocking flying matter flying from said plasma toward said filter, a surface of said filter protecting member being substantially orthogonal to a line connecting said plasma and said filter, and said filter protecting member having a radius that satisfies the following condition $$\frac{r2 \cdot D1}{r2 + r3} < d2 < \frac{(r3 + r4) \cdot d1}{r1 + r2 + r3 + r4}$$

where d2 represents the radius of said filter protecting member, d1 represents a radius of the hole of said collector mirror, D1 represents a radius of said filter, r1 represents a distance between said collector mirror and said laser beam application point, r2 represents a distance between said laser beam application point and said filter protecting member, r3 represents a distance between said filter protecting member and said filter, and r4 represents a distance between said filter and said intermediate focusing point.

14. An extreme ultra violet light source apparatus for generating extreme ultra violet light by applying a laser beam to a target material, said apparatus comprising:
   an extreme ultra violet light generation chamber in which extreme ultra violet light is generated;
   a target material supply unit which supplies a target material into said extreme ultra violet light generation chamber;
   a laser source which applies a laser beam to the target material supplied into said extreme ultra violet light generation chamber to generate plasma;
   collection optics which collects extreme ultra violet light radiated from said plasma;
   a filter which filters the extreme ultra violet light collected by said collection optics;
   at least one flying matter trapping unit which is provided on an inner wall of said extreme ultra violet light generation chamber, and which traps flying matter emitted from said plasma; and
   a filter protecting member which is provided between said plasma and said filter, and which protects said filter by blocking flying matter flying from said plasma toward said filter, a surface of said filter protecting member forming a predetermined angle θ with a surface orthogonal to a line connecting said plasma and said filter, where 0°<θ<90°, so as to reflect the flying matter toward said at least one flying matter trapping unit.

15. An extreme ultra violet light source apparatus for generating extreme ultra violet light by applying a laser beam to a target material, said apparatus comprising:
   an extreme ultra violet light generation chamber in which extreme ultra violet light is generated;
   a target material supply unit which supplies a target material into said extreme ultra violet light generation chamber;
   a laser source which applies a laser beam to the target material supplied into said extreme ultra violet light generation chamber to generate plasma;
   collection optics which collects extreme ultra violet light radiated from said plasma;
   a filter which filters the extreme ultra violet light collected by said collection optics;
   a first filter protecting member which is provided between said plasma and said filter, and which protects said filter by blocking flying matter flying from said plasma toward said filter; and
   a second filter protecting member which is provided on an inner wall of said extreme ultra violet light generation chamber at an inclination toward said plasma, and which protects said filter by blocking the flying matter emitted from said plasma.

* * * * *